(12) United States Patent
Ishikawa et al.

(10) Patent No.: US 6,468,675 B1
(45) Date of Patent: Oct. 22, 2002

(54) ORGANIC ELECTROLUMINESCENT DEVICE HAVING HIGH LUMINANCE EFFICIENCY

(75) Inventors: Hitoshi Ishikawa; Satoru Toguchi; Atsushi Oda, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/321,315

(22) Filed: May 27, 1999

(30) Foreign Application Priority Data

May 29, 1998 (JP) .......................................... 10-148778

(51) Int. Cl.[7] .............................................. H05B 33/12
(52) U.S. Cl. ...................... 428/690; 428/917; 313/504; 313/506
(58) Field of Search .................. 428/690, 704, 428/917; 313/504, 506; 564/427, 428, 429

(56) References Cited

U.S. PATENT DOCUMENTS 5,443,922 A * 8/1995 Nishizaki et al. ........... 428/690

FOREIGN PATENT DOCUMENTS

| JP | 3-200889 | 9/1991 |
|----|----------|--------|
| JP | 5-239455 | 9/1993 |
| JP | 7-138561 | 5/1995 |
| JP | 8-20771 | 1/1996 |
| JP | 8-23965 | 1/1996 |
| JP | 8-40995 | 2/1996 |
| JP | 8-40997 | 2/1996 |
| JP | 8-53397 | 2/1996 |
| JP | 8-87122 | 4/1996 |
| JP | 8-193191 | 7/1996 |
| JP | 9-95470 | 4/1997 |
| JP | 9-208533 | 8/1997 |
| JP | 9-268284 | 10/1997 |
| JP | 10-88120 | * 4/1998 |

OTHER PUBLICATIONS

English language (machine–assisted) translation of JP 10–88120 (Apr. 07, 1998).*
Grant & Hackh's Chemical Dictionary, 5th ed., copyright 1987, McGraw–Hill, Inc., pp. xii, 294 and 295.*
C.W. Tang and S.A. Vanslyke; Organic Electroluminescent Diodes; Appl. Phys. Lett 51 (12) Sep. 21, 1987 pp. 913–915.

* cited by examiner

*Primary Examiner*—Marie Yamnitzky

(57) ABSTRACT

An organic EL device includes a hole transport layer and a luminescent layer both disposed between an anode and a cathode. The luminescent layer includes a compound expressed in a general formula [1] as follows:

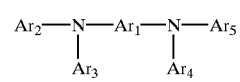

[1]

wherein $Ar_1$ represents a substituted or non-substituted arylene group having 5–30 carbons, each of $Ar_2$ to $Ar_5$ independently represents a substituted or non-substituted aryl group having 6–20 carbons, and at least one of $Ar_2$ to $Ar_5$ has a styryl group expressed in a general formula [2] as follows:

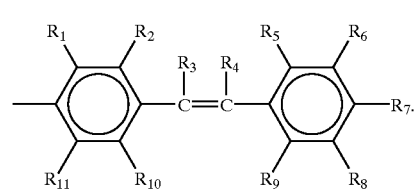

[2]

9 Claims, 2 Drawing Sheets

ORGANIC ELECTROLUMINESCENT DEVICE HAVING HIGH LUMINANCE EFFICIENCY

BACKGROUND OF THE INVENTION (a) Field of the Invention

The present invention relates to an organic electroluminescent device having an excellent luminescence property such as high luminance efficiency.

(b) Description of the Related Art

An organic electroluminescent device (which will hereinafter be called "organic EL device") is a light-emitting device which makes use of the principle that when an electric field is applied, a fluorescent material emits light in response to the charge recombination of holes injected from an anode and electrons injected from a cathode. After C. W. Tang et al. of Eastman Kodak Company reported a low-voltage-driven organic EL device using a double layered structure (C. W. Tang, S. A. Vanslyke, Applied Physics Letters, Vol. 51, 913 (1987) and the like), studies on an organic EL device have been briskly carried out. Tang et al. reported an organic EL device using tris(8-hydroxyquinolinol aluminum) in a light-emitting layer and a triphenyldiamine derivative in a hole-transporting layer. This stacked structure gives such advantages as an improvement in the injection efficiency of holes into the light-emitting layer; blocking of electrons injected from a cathode, which increase the efficiency of exciton production from charge recombination; and confinement of the excitons into the light-emitting layer. A double layered structure composed of a hole-injecting and transporting layer and an electron-transporting and light-emitting layer or a triple layered structure composed of a hole-injecting and transporting layer, a light-emitting layer and an electron-injecting and transporting layer is well known as an organic EL device. In order to increase the recombination efficiency of injected holes and electrons, various improvements in the device structure or fabrication process have been introduced to such multi-layered devices.

As a hole transport material, aromatic diamine derivatives such as N,N'-diphenyl-N,N'-bis(3-methylphenyl)-[1,1'-biphenyl]-4,4'-diamine are well known (for example, Patent Publications JP-A-8-20771, JP-A-8-40995, JP-A-8-40997, JP-A-8-53397, and JP-A-8-87122).

As an electron transporting material, oxadiazole derivatives, triazole derivatives and the like are well known.

Chelate complexes such as tris(8-quinolinolate)aluminum complex, coumarin derivatives, tetraphenylbutadiene derivatives, bisstyrylarylene derivatives, oxadiazole derivatives and the like are known as light emitting materials. Since various color light in a visible region from blue to red are obtained from these light-emitting materials, there is increased expectation for industrialization of a full color organic EL device (refer to, e.g., JP-A-8-23965, JP-A-7-138561, and JP-A-3-200889)

In recent days, organic EL devices with high brightness and long lifetime have been disclosed or reported. For example, JP-A-9-268284 describes diphenylamino arylene styryl derivatives used for a luminescent layer and aromatic tertiary amine used for a hole transport layer, but their efficiencies are not enough for most applications. We have found that the EL device having a combination of a specific one of diphenylamino arylene styryl derivatives as the luminescent material and aromatic tertiary amine as the hole transport material as described in the publication exhibited low luminescent property.

SUMMARY OF THE INVENTION

It is therefore an object of the present invention to provide materials for the organic EL devices having high luminance and long-term operating lifetime.

The inventors found that an organic EL device having a specific one of diphenylamino arylene styryl derivatives as a luminescent layer and a specific one of triamine compounds as a hole transport material in combination has much higher luminance and thus higher luminescent efficiency than the organic EL device having an aromatic diamine compound as a hole transport material. JP-A-8-193191, JP-A-9-95470, JP-A-9-208533, JP-A-5-239455 etc. describe the triphenyl amine derivatives used as hole transport materials; however, the described materials in these patent applications do not include diphenylamino arylene styryl derivatives, which we have found.

The inventors also found that, if a substituent group other than hydrogen exists in the beta position in a diarylamino naphthalene derivative having a diaryl amine group in the alpha position or exists in the alpha or gamma position in a diarylamino naphthalene derivative having a diaryl amine group in the beta position, the organic EL device having a luminescent layer including such a diarylamino naphthalene derivative exhibited an especially excellent blue emission. The present invention is based on these findings.

Thus, the present invention provides, in a first aspect thereof, an organic EL device having a luminescent layer and a hole transport layer and including one or more than one organic thin-film layers disposed between an anode and a cathode.

The luminescent layer includes, in the form of a mixture or a single substance, the compound expressed in a general formula [1] as follows:

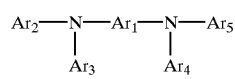

[1]

wherein $Ar_1$ represents a substituted or non-substituted arylene group having 5–30 carbons, each of $Ar_2$ to $Ar_5$ independently represents a substituted or non-substituted aryl group having 6–20 carbons, and at least one of $Ar_2$ to $Ar_5$ has a styryl group expressed in a general formula [2] as follows:

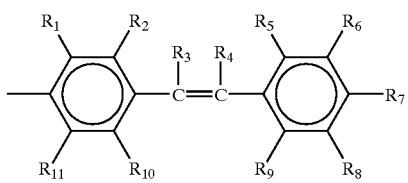

[2]

wherein each of $R_1$ to $R_{11}$ independently represents hydrogen atom, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group. $Ar_2$ and $Ar_3$ and/or $Ar_4$ and $Ar_5$ may form a ring therebetween.

The hole transport layer includes, in the form of a mixture or a single substance, the compound expressed in a general formula [3] as follows

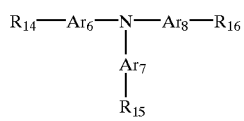

[3]

wherein each of $Ar_6$ to $Ar_8$ represents a substituted or non-substituted arylene group having 5–30 carbons, each of $R_{14}$ to $R_{16}$ independently represents hydrogen atom, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group.

In the present invention, $Ar_1$ in the general formula [1] may be preferably naphthylene group or anthrylene group.

In a second aspect of the present invention, an organic EL device has at least a hole transport layer between an anode and thode, wherein the hole transport layer includes, in the form of a mixture or a single substance, the compound expressed in the above general formula [3].

In the above formula [3], at least two of R14 to R16 in the general formula [3] may be a diarylamino group expressed by —$NAr_9Ar_{10}$ wherein each of $Ar_9$ and $Ar_{10}$ independently represents a substituted or non-substituted aryl group.

In the above formula [3], each of $R_{14}$ to $R_{16}$ may preferably represent a substituted or non-substituted 4-(diphenylamino)styryl group.

In a third aspect of the present invention, an organic EL device includes at least a luminescence layer between an anode and a cathode, wherein the luminescent layer includes, in the form of a mixture or a single substance, the compound expressed in a general formula [4] as follows:

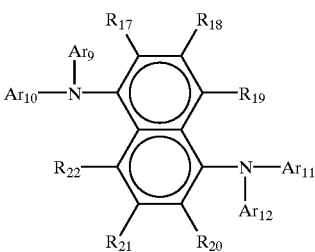

[4]

wherein each of $Ar_9$ to $Ar_{12}$ independently represents a substituted or non-substituted aryl group having 6–20 carbons, and $Ar_9$ and $Ar_{10}$ and/or $Ar_{11}$ and $Ar_{12}$ may form a ring therebetween. Each of $R_{17}$ to $R_{22}$ in the general formula [4] independently represents hydrogen atom, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted a romatic heterocyclic group, substituted or non-substituted aralkyl group, substituted or non-substituted aryloxy group, substituted or non-substituted alkoxycarbonyl group, or a carboxyl group, wherein $R_{17}$ and $R_{20}$ are not hydrogen atoms.

In the above general formula [4], at least one of $Ar_9$ to $Ar_{12}$ may be expressed in a general formula [5] as follows:

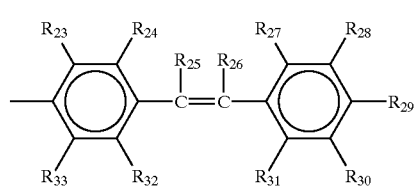

[5]

wherein each of $R_{23}$ to $R_{33}$ independently represents hydrogen atom, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group.

In a fourth aspect of the present invention, an organic EL device having between an anode and a cathode at least a luminescent layer including, in the form of a mixture or a single substance, the compound expressed in a general formula [6] as follows:

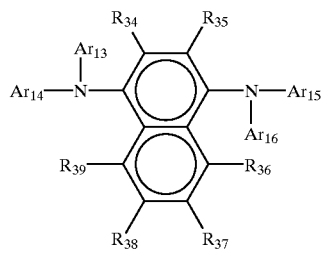

[6]

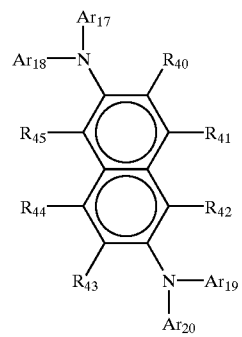

[7]

wherein each of $Ar_{13}$ to $Ar_{16}$ independently represents a substituted or non-substituted aryl group having 6–20 carbons, $Ar_{13}$ and $Ar_{14}$ and/or $Ar_{15}$ and $Ar_{16}$ may form a ring therebetween, each of $R_{34}$ to $R_{39}$ independently represents hydrogen atom, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group, and $R_{34}$ and $R_{35}$ are not hydrogen atoms.

In the above general formula [6], at least one of $Ar_{,13}$ to $Ar_{,16}$ may be expressed in the general formula [5].

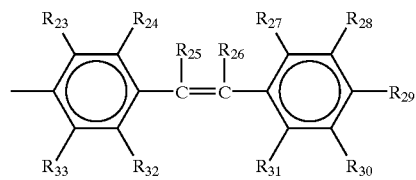

[5]

wherein each of $R_{23}$ and $R_{33}$ independently represents hydrogen atom, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group.

In a fifth aspect of the present invention, the luminescent layer includes, in the form of a mixture or a single substance, the compound expressed in a general formula [7]

wherein each of $Ar_{17}$ to $Ar_{20}$ independently represents a substituted or non-substituted aryl group having 6–20 carbons, $Ar_{17}$ and $Ar_{18}$ and/or $Ar_{19}$ and $Ar_{20}$ may form a ring therebetween, each of $R_{40}$ to $R_{45}$ independently represents hydrogen atoin, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group, and $R_{40}$, $R_{42}$, $R_{43}$ and $R_{45}$ are not hydrogen atoms.

In the above formula [7], at least one of $Ar_{17}$ to $Ar_{20}$ may be expressed in the general formula [5] as follows:

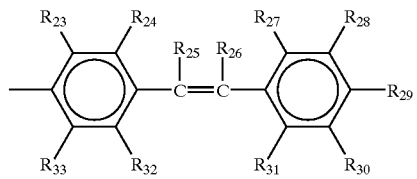

[5]

wherein each of $R_{23}$ to $R_{33}$ independently represents hydrogen atom, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocar sodium hydride bon group, substituted or non-substituted aromatic heterocyclic group, substituted or non-substituted aralkyl group, substituted or non-substituted aryloxy group, substituted or non-substituted alkoxycarbonyl group, or a carboxyl group.

In the compound expressed in the general formula [1] in one aspect of the present invention, at least one of $Ar_2$ to $Ar_5$ is expressed in the general formula [2]. In these general formula [1] and [2], the compound used as $Ar_1$ represents a substituted or non-substituted arylene group having 5–30 carbons. The number of carbons excludes the number of carbons of substituent. Examples of such compounds or groups include: aromatic hydrocarbons and condensed polycyclic hydrocarbons, such as benzene, naphthalene, anthrathene, phenanthrene, napthathene, pyrene, biphenyl, and terphenyl; heterocyclic compounds, such as carbazole, pyrrole, thiophene, furane, imidazole, pyrazole, isothiazole, isooxazole, pyridine, pyradine, pyrimidine, pyridazine, furazane, thianthrene, isobenzofuran, phenoxazine, indolizine, indole, isoindole, 1H-indazole, purine, quinoline, isoquinoline, phthalazine, naphthylizine, quinoxaline, quinazoline, cinnoline, pteridine, carbazole, β-carbazole, phenanthridine, acridine, perimidine, phenanthroline, phenazine, phenothiazine, and phenoxazine; a divalent group having a structure formed by removal of two hydrogen atoms from condensed heterocyclic compounds; and derivatives thereof. Preferable groups are naphthylene and anthrylene groups.

Each of $Ar_2$ to $Ar_5$ independently represents a substituted or non-substituted aryl group having 6–20 carbons, and at least one of $Ar_2$ to $Ar_5$ is styryl group expressed in the general formula [2]. $Ar_2$ and $Ar_3$ and/or $Ar_4$ and $Ar_5$ may form a ring therebetween. Examples of the aryl group having 6–20 carbons include phenyl group, naphthyl group, anthryl group, phenanthryl group, naphthacenyl group, and pyrenyl group. Examples of the group forming a ring include carbazoryl group. Each of $R_1$ to $R_{11}$ independently represents hydrogen atom, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group.

Examples of the substituted or non-substituted arylene group include phenylene group, naphthylene group, anthrylene group, phenanthrylene group, naphthacenylene group, pyrenylene group. Examples of the halogen group include fluorine, chlorine, bromine and iodine.

The substituted or non-substituted amino group is expressed by $-NX_1X_2$, wherein each of given $X_1$ and $X_2$ independently represents hydrogen atom, methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, 1,2,3-trinitropropyl group, phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 4-styrylphenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl) phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9- phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-hurazanyl group, 2 thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-methyl-3-indolyl group, 4-methyl-3-indolyl group, 2-t-butyl1-indolyl group, 4-t-butyl1-indolyl group, 2-t-butyl3-indolyl group, and 4-t-butyl3-indolyl group.

Examples of the substituted or non-substituted alkyl group include methyl group, ethyl group, ropyl group, isopropyl group, n-butyl, s-butyl, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-hydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-chloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoehtyl group, 1,3-dicyanoisopropy group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group, and 1,2,3-trinitropropyl group.

Examples of the substituted or non-substituted alkenyl group include vinyl group, allyl group, 1-butenyl group, 2-butenyl group, 3-butenyl group, 1,3-butanedienyl group, 1-methylvinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl-1-butenyl group and 3-phenyl-1-butenyl group.

Examples of the substituted or non-substituted cycloalkyl group include cyclopropyl group, cyclobutyl group, cyclopentyl group, cyclohexyl group, and 4-methylcyclohexyl group.

Examples of the substituted or non-substituted alkoxy group include groups represented by —OY wherein Y may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-chloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-chloroethyl group, 2-iodoethyl group, 2-iodoisobutyl group, 1,2-diiodoethyl group, 1,3-diiodo isopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the substituted or non-substituted aromatic hydrocarbon group include phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 3-methyl-2-naphthyl group, 4-methyl-1-naphthyl group, 4-methyl-1-anthril group, 4'-methylbiphenylyl group and 4"-t-butyl-p-terphenyl-4-yl group.

Examples of the substituted or non-substituted aromatic heterocyclic group include 1-pyrrolyl group, 2-pyrrolyl group, 3-pyrrolyl group, pyrazinyl group, 2-pyridinyl group, 3-pyridinyl group, 4-pyridinyl group, 1-indolyl group, 2-indolyl group, 3-indolyl group, 4-indolyl group, 5-indolyl group, 6-indolyl group, 7-indolyl group, 1-isoindolyl group, 2-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-isoquinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl, group, 9-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 10-phenothiazinyl group, 1-phenoxazinyl group, 2-phenoxazinyl group, 3-phenoxazinyl group, 4-phenoxazinyl group, 10-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-mehyl-3-indolyl group, 4-methyl-3-indolyl group, 2-t-butyl1-indolyl group, 4-t-butyl1-indolyl group, 2-t-butyl3-indolyl group and 4-t-butyl3-indolyl group.

Examples of the substituted or non-substituted aralkyl group include benzyl group, 1-phenylethyl group, 2-phenylethyl group, 1-phenylisopropyl group, 2-phenylisopropyl group, phenyl-t-butyl group, α-naphthylmethyl group, 1-α-naphthylethyl group, 2-α-naphthylethyl group, 1-α-naphthylisopropyl group, 2-α-naphthylisopropyl group, β-naphthylmethyl group, 1-β-naphthylethyl group, 2-β-naphthylmethyl group, 1-β-naphthylisopropyl group, 2-β-naphthylisopropyl group, 1-pyrrolylmethyl group, 2-(1-pyrrolyl)ethyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group and 1-chloro-2-phenylisopropyl group.

The substituted or non-substituted aryloxy group is represented by —OZ, wherein Z may be phenyl group, 1-naphthyl group, 2-naphthyl group, 1-anthryl group, 2-anthryl group, 9-anthryl group, 1-phenanthryl group, 2-phenanthryl group, 3-phenanthryl group, 4-phenanthryl group, 9-phenanthryl group, 1-naphthacenyl group, 2-naphthacenyl group, 9-naphthacenyl group, 1-pyrenyl group, 2-pyrenyl group, 4-pyrenyl group, 2-biphenylyl group, 3-biphenylyl group, 4-biphenylyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl) phenyl group, 3-methyl-2-naphthyl group, 4-methyl-1-naphthyl group, 4-methyl-1-anthryl group, 4'-methylbiphenylyl group, 4"-t-butyl-p-terphenyl-4-yl group, 2-pyrrolyl group, 3-pyrrolyl group, pyrazinyl group, 2-pyridinyl group, 3-pyridinyl group, 4-pyridinyl group, 2-indolyl group, 3-indolyl group, 4-indolyl group, 5-indolyl group, 6-indolyl group, 7-indolyl group, 1-isoindolyl group, 3-isoindolyl group, 4-isoindolyl group, 5-isoindolyl group, 6-isoindolyl group, 7-isoindolyl group, 2-furyl group, 3-furyl group, 2-benzofuranyl group, 3-benzofuranyl group, 4-benzofuranyl group, 5-benzofuranyl group, 6-benzofuranyl group, 7-benzofuranyl group, 1-isobenzofuranyl group, 3-isobenzofuranyl group, 4-isobenzofuranyl group, 5-isobenzofuranyl group, 6-isobenzofuranyl group, 7-isobenzofuranyl group, 2-quinolyl group, 3-quinolyl group, 4-quinolyl group, 5-quinolyl group, 6-quinolyl group, 7-quinolyl group, 8-quinolyl group, 1-isoquinolyl group, 3-isoquinolyl group, 4-iso quinolyl group, 5-isoquinolyl group, 6-isoquinolyl group, 7-isoquinolyl group, 8-isoquinolyl group, 2-quinoxalinyl group, 5-quinoxalinyl group, 6-quinoxalinyl group, 1-carbazolyl group, 2-carbazolyl group, 3-carbazolyl group, 4-carbazolyl group, 1-phenanthridinyl group, 2-phenanthridinyl group, 3-phenanthridinyl group, 4-phenanthridinyl group, 6-phenanthridinyl group, 7-phenanthridinyl group, 8-phenanthridinyl group, 9-phenanthridinyl group, 10-phenanthridinyl group, 1-acridinyl group, 2-acridinyl group, 3-acridinyl group, 4-acridinyl group, 9-acridinyl group, 1,7-phenanthroline-2-yl group, 1,7-phenanthroline-3-yl group, 1,7-phenanthroline-4-yl group, 1,7-phenanthroline-5-yl group, 1,7-phenanthroline-6-yl group, 1,7-phenanthroline-8-yl group, 1,7-phenanthroline-9-yl group, 1,7-phenanthroline-10-yl group, 1,8-phenanthroline-2-yl group, 1,8-phenanthroline-3-yl group, 1,8-phenanthroline-4-yl group, 1,8-phenanthroline-5-yl group, 1,8-phenanthroline-6-yl group, 1,8-phenanthroline-7-yl group, 1,8-phenanthroline-9-yl group, 1,8-phenanthroline-10-yl group, 1,9-phenanthroline-2-yl group, 1,9-phenanthroline-3-yl group, 1,9-phenanthroline-4-yl group, 1,9-phenanthroline-5-yl group, 1,9-phenanthroline-6-yl group, 1,9-phenanthroline-7-yl group, 1,9-phenanthroline-8-yl group, 1,9-phenanthroline-10-yl group, 1,10-phenanthroline-2-yl group, 1,10-phenanthroline-3-yl group, 1,10-phenanthroline-4-yl group, 1,10-phenanthroline-5-yl group, 2,9-phenanthroline-1-yl group, 2,9-phenanthroline-3-yl group, 2,9-phenanthroline-4-yl group, 2,9-phenanthroline-5-yl group, 2,9-phenanthroline-6-yl group, 2,9-phenanthroline-7-yl group, 2,9-phenanthroline-8-yl group, 2,9-phenanthroline-10-yl group, 2,8-phenanthroline-1-yl group, 2,8-phenanthroline-3-yl group, 2,8-phenanthroline-4-yl group, 2,8-phenanthroline-5-yl group, 2,8-phenanthroline-6-yl group, 2,8-phenanthroline-7-yl group, 2,8-phenanthroline-9-yl group, 2,8-phenanthroline-10-yl group, 2,7-phenanthroline-1-yl group, 2,7-phenanthroline-3-yl group, 2,7-phenanthroline-4-yl group, 2,7-phenanthroline-5-yl group, 2,7-phenanthroline-6-yl group, 2,7-phenanthroline-8-yl group, 2,7-phenanthroline-9-yl group, 2,7-phenanthroline-10-yl group, 1-phenazinyl group, 2-phenazinyl group, 1-phenothiazinyl group, 2-phenothiazinyl group, 3-phenothiazinyl group, 4-phenothiazinyl group, 1-phenoxazinyl group, 2-phenoxazinyl group, 3-phenoxazinyl group, 4-phenoxazinyl group, 2-oxazolyl group, 4-oxazolyl group, 5-oxazolyl group, 2-oxadiazolyl group, 5-oxadiazolyl group, 3-furazanyl group, 2-thienyl group, 3-thienyl group, 2-methylpyrrole-1-yl group, 2-methylpyrrole-3-yl group, 2-methylpyrrole-4-yl group, 2-methylpyrrole-5-yl group, 3-methylpyrrole-1-yl group, 3-methylpyrrole-2-yl group, 3-methylpyrrole-4-yl group, 3-methylpyrrole-5-yl group, 2-t-butylpyrrole-4-yl group, 3-(2-phenylpropyl)pyrrole-1-yl group, 2-methyl-1-indolyl group, 4-methyl-1-indolyl group, 2-mehyl-3-indolyl group, 4-methyl-3-indolyl group, 2-t-butyl1-indolyl group, 4-t-butyl1-indolyl group, 2-t-butyl3-indolyl group and 4-t-butyl3-indolyl group.

The substituted or non-substituted alkoxycarbonyl group is represented by —COOY, wherein Y may be methyl group, ethyl group, propyl group, isopropyl group, n-butyl group, s-butyl group, isobutyl group, t-butyl group, n-pentyl group, n-hexyl group, n-heptyl group, n-octyl group, hydroxymethyl group, 1-hydroxyethyl group, 2-hydroxyethyl group, 2-hydroxyisobutyl group, 1,2-dihydroxyethyl group, 1,3-dihydroxyisopropyl group, 2,3-dihydroxy-t-butyl group, 1,2,3-trihydroxypropyl group, chloromethyl group, 1-chloroethyl group, 2-chloroethyl group, 2-chloroisobutyl group, 1,2-dichloroethyl group, 1,3-dichloroisopropyl group, 2,3-dichloro-t-butyl group, 1,2,3-trichloropropyl group, bromomethyl group, 1-bromoethyl group, 2-bromoethyl group, 2-bromoisobutyl group, 1,2-dibromoethyl group, 1,3-dibromoisopropyl group, 2,3-dibromo-t-butyl group, 1,2,3-tribromopropyl group, iodomethyl group, 1-iodoethyl group, 2-iodoethyl group, 2-iodoisobutyl group, 1,2-diiodoethyl group, 1,3-diiodoisopropyl group, 2,3-diiodo-t-butyl group, 1,2,3-triiodopropyl group, aminomethyl group, 1-aminoethyl group, 2-aminoethyl group, 2-aminoisobutyl group, 1,2-diaminoethyl group, 1,3-diaminoisopropyl group, 2,3-diamino-t-butyl group, 1,2,3-triaminopropyl group, cyanomethyl group, 1-cyanoethyl group, 2-cyanoethyl group, 2-cyanoisobutyl group, 1,2-dicyanoethyl group, 1,3-dicyanoisopropyl group, 2,3-dicyano-t-butyl group, 1,2,3-tricyanopropyl group, nitromethyl group, 1-nitroethyl group, 2-nitroethyl group, 2-nitroisobutyl group, 1,2-dinitroethyl group, 1,3-dinitroisopropyl group, 2,3-dinitro-t-butyl group and 1,2,3-trinitropropyl group.

Examples of the compounds expressed in the general formula [1] in the present invention include, but not limited thereto, the compounds shown below.

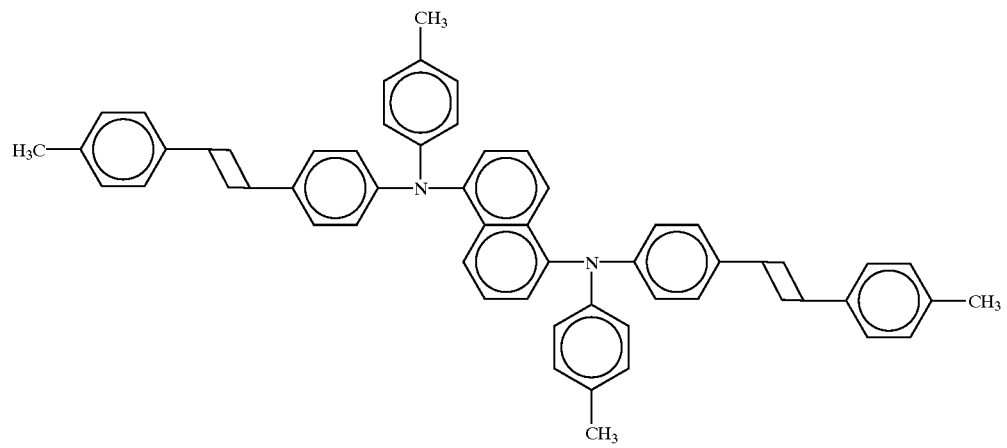
(1)
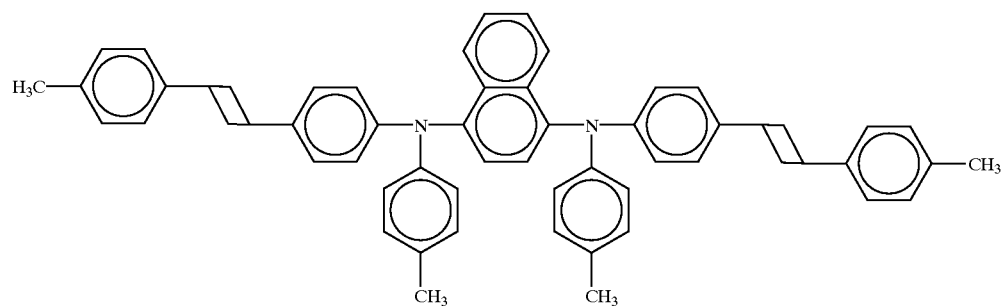
(2)
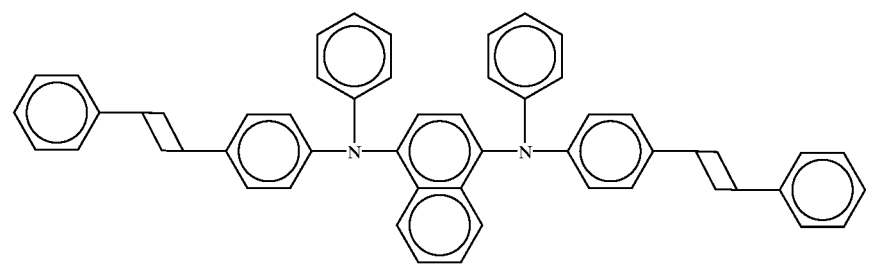
(3)
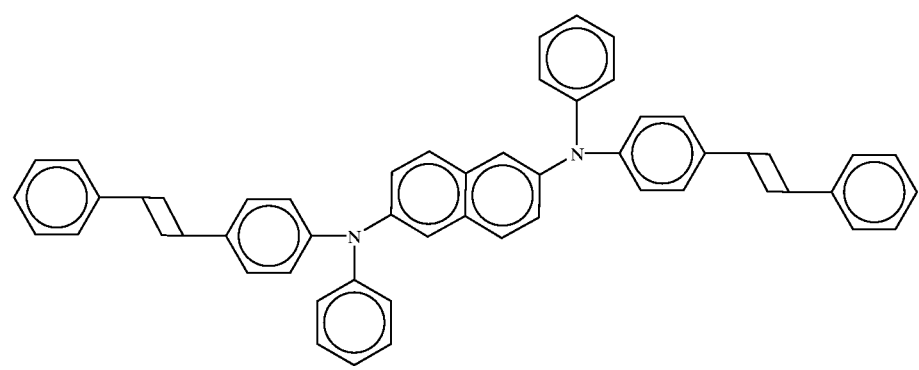
(4)

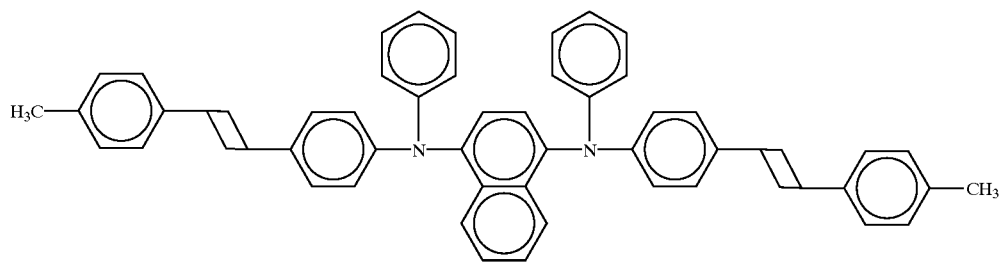
(5)
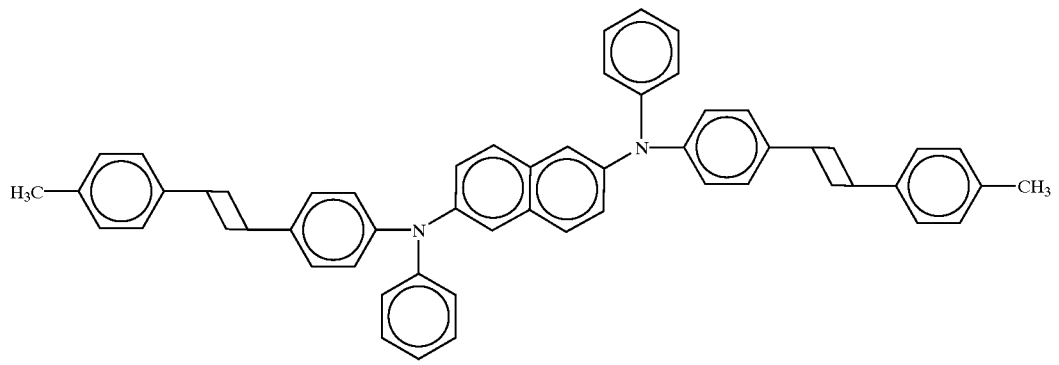
(6)
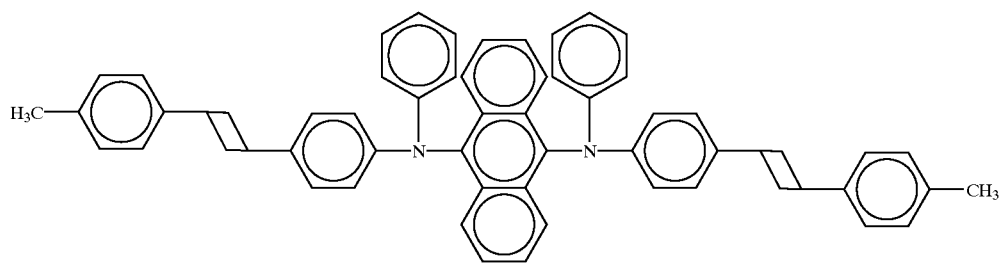
(7)
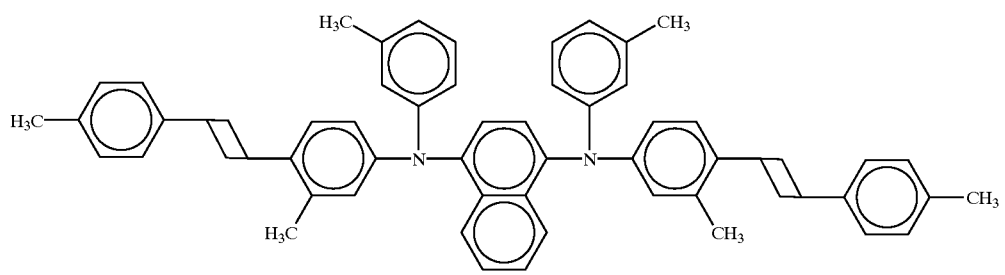
(8)
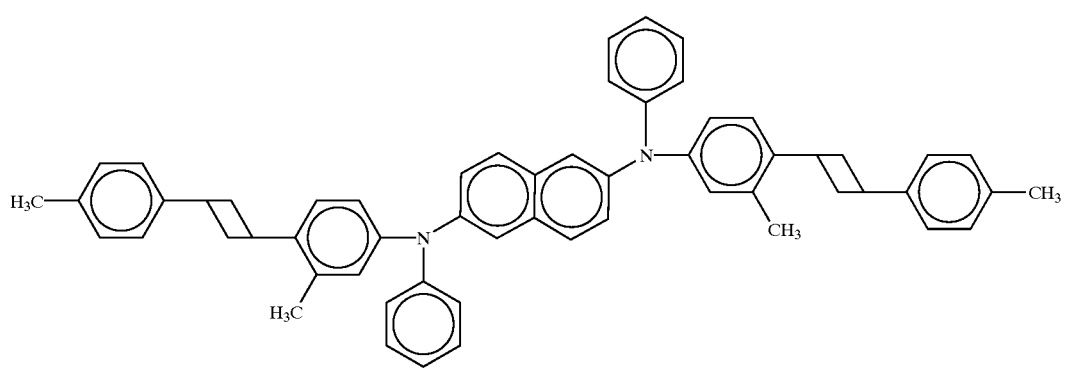
(9)

-continued
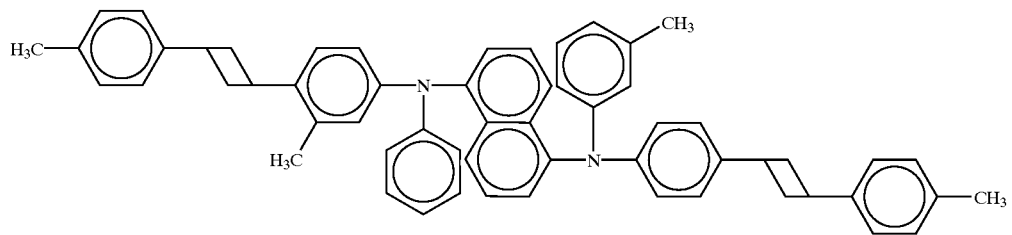
(10)
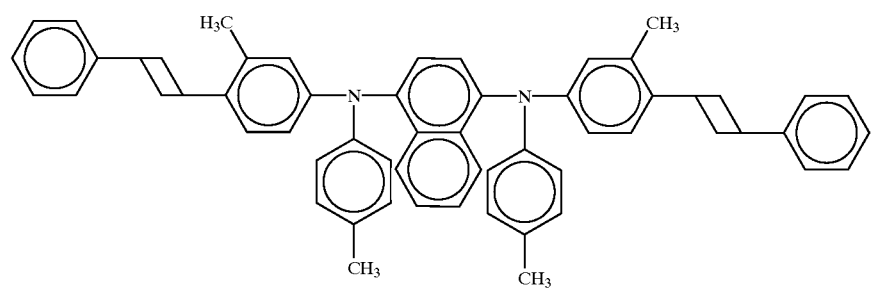
(11)
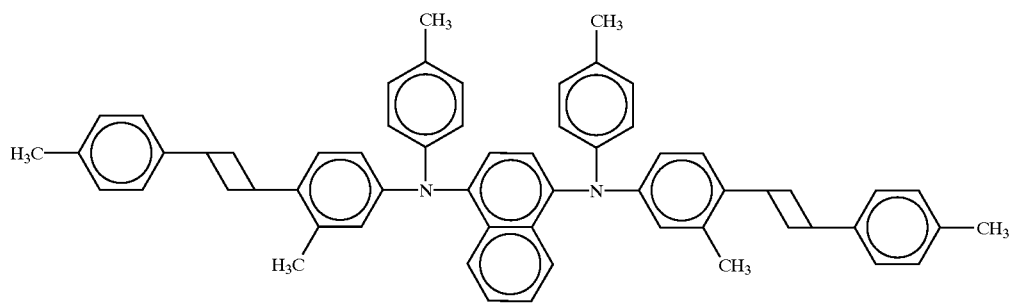
(12)
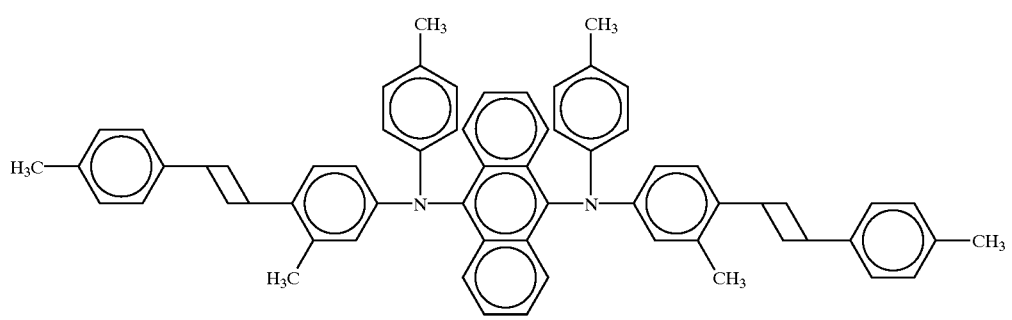
(13)

(14)
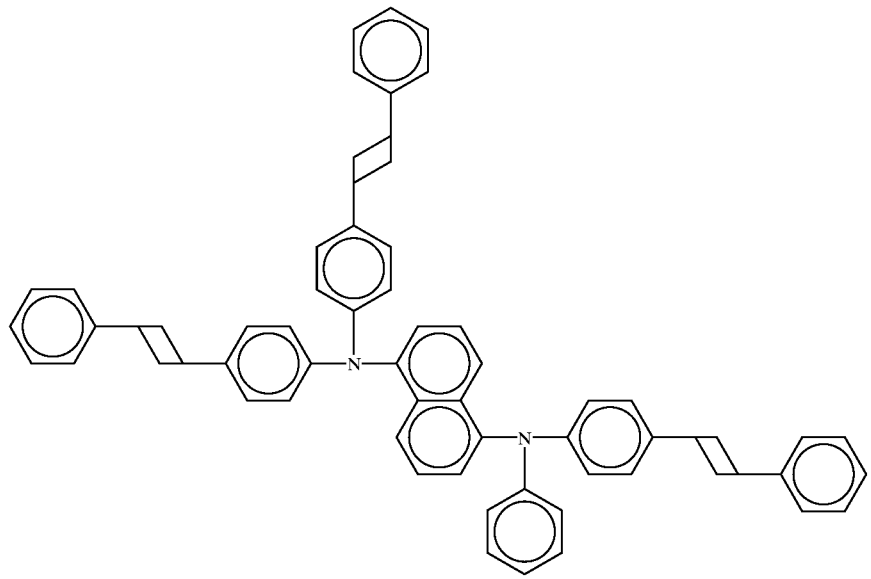
(15)
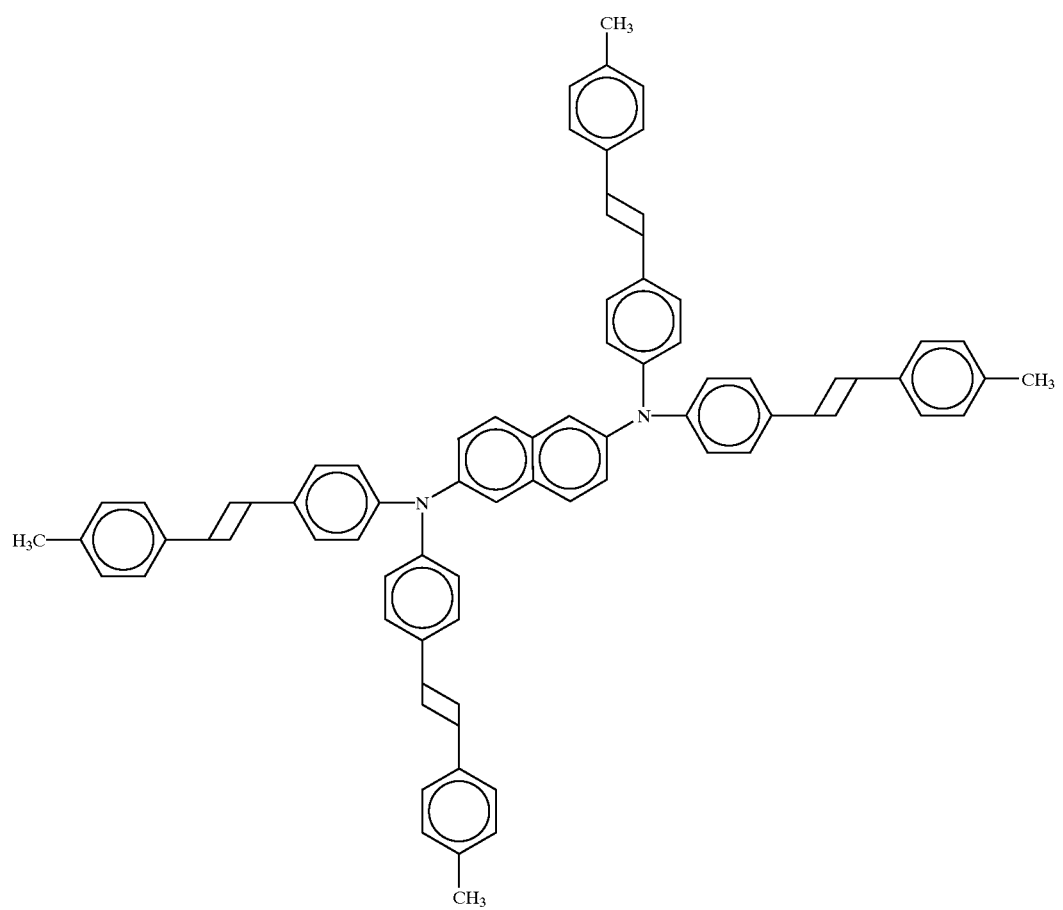

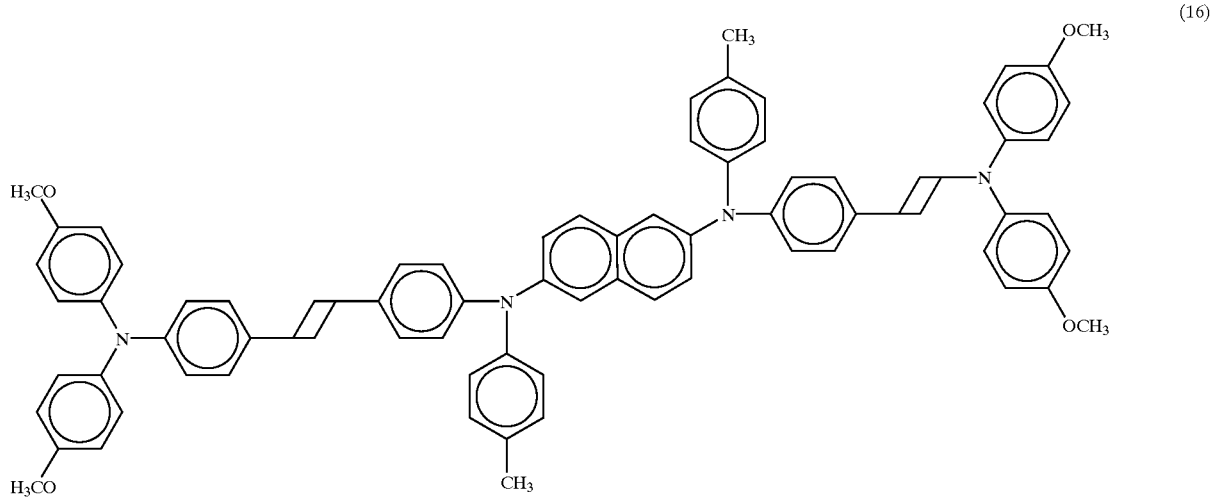
(16)
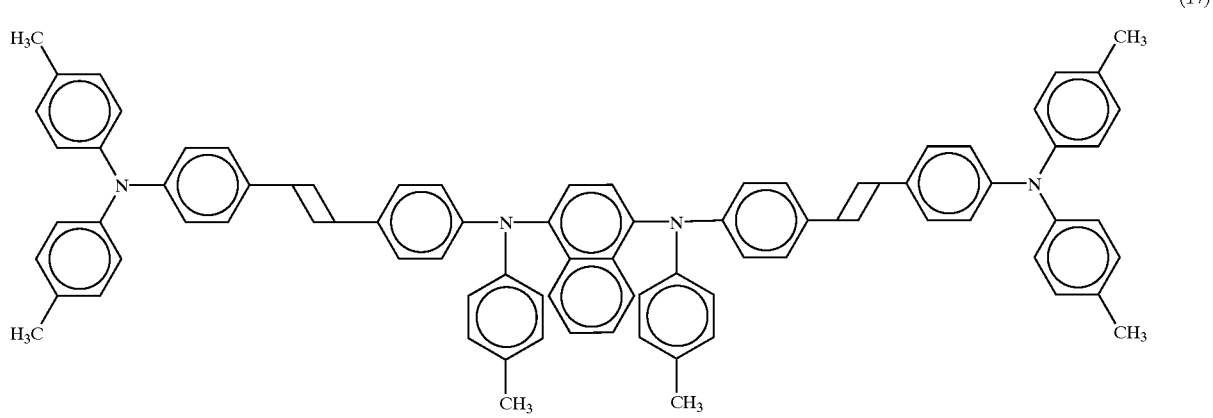
(17)
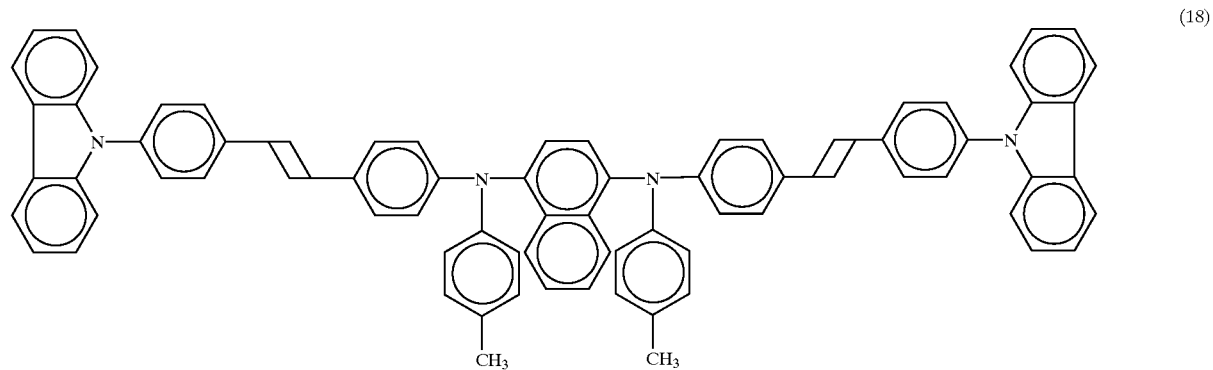
(18)

-continued
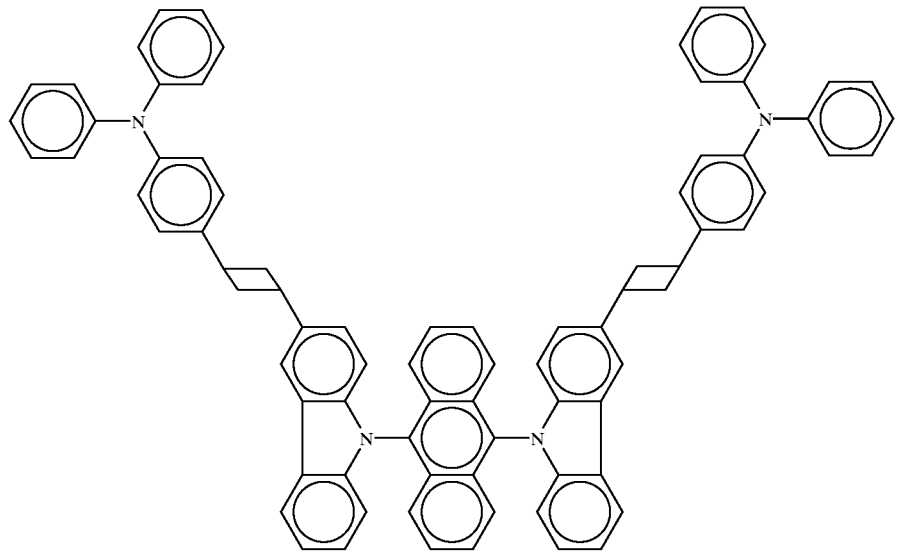
(19)
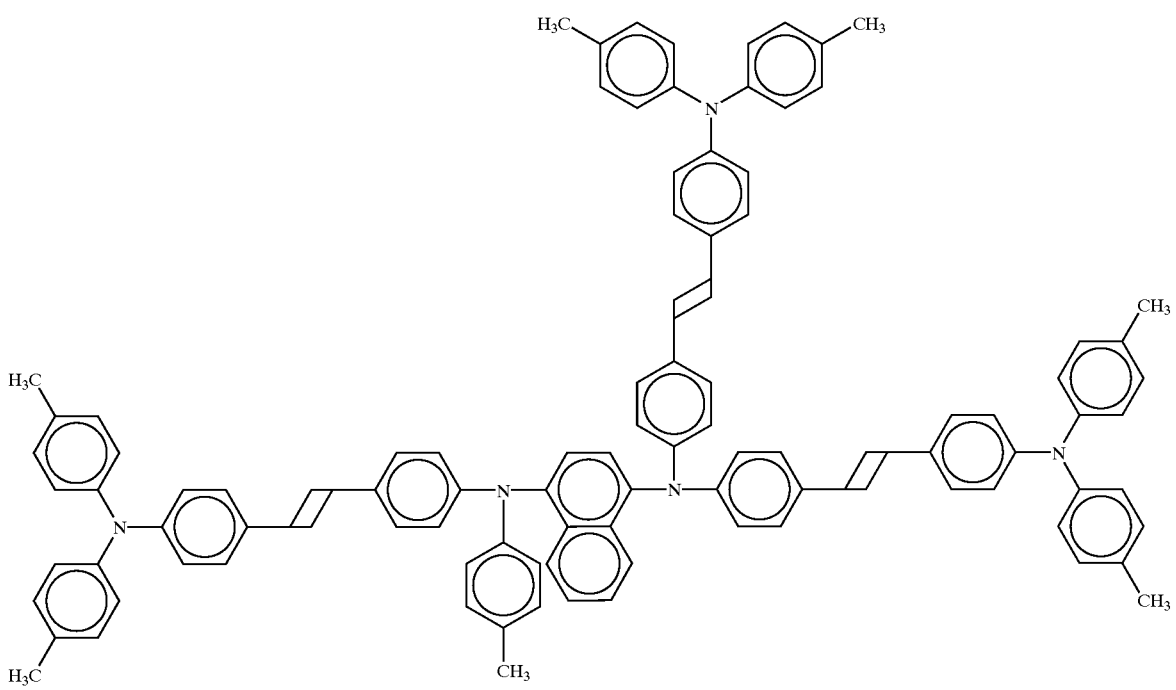
(20)

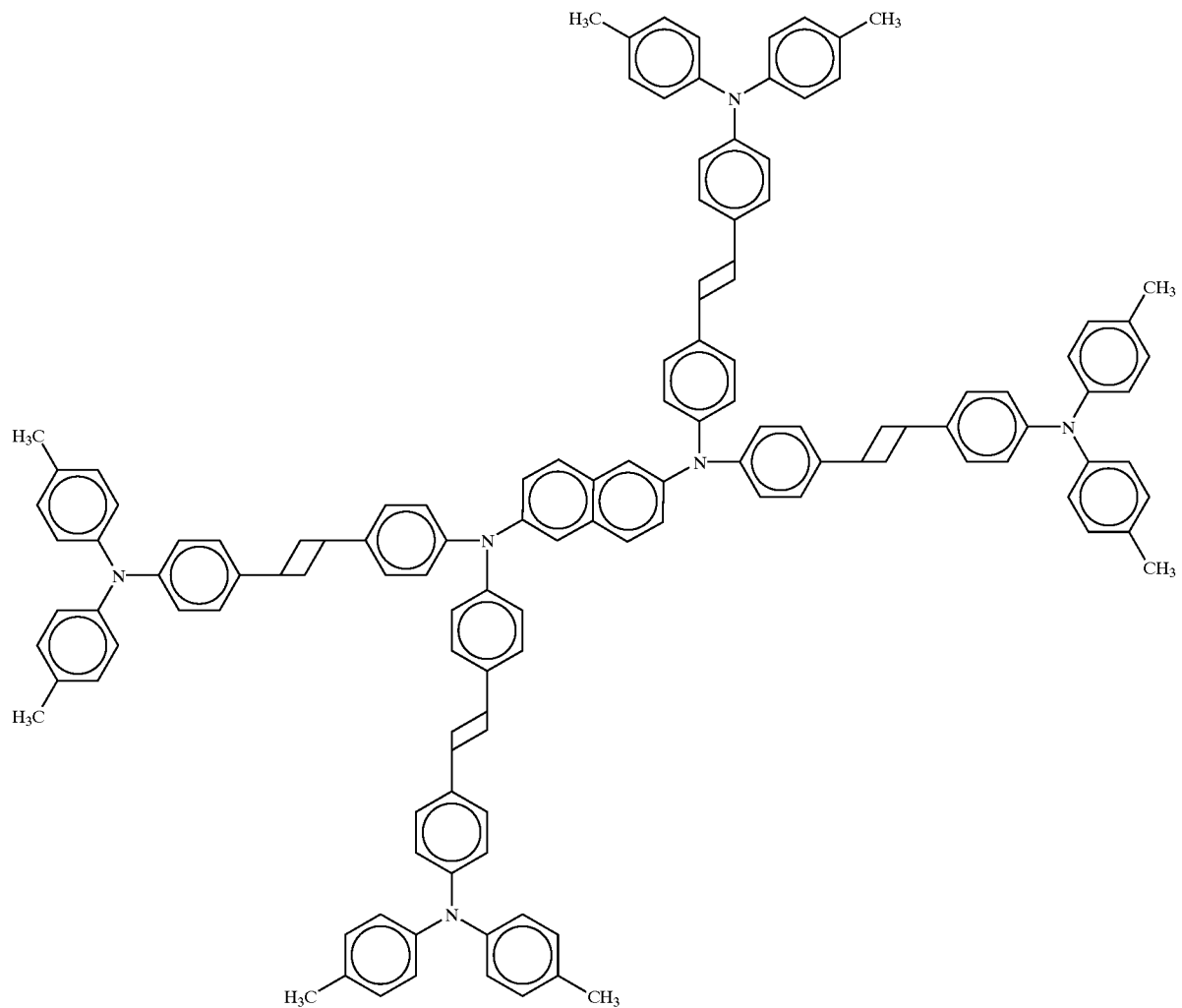
(21)

-continued
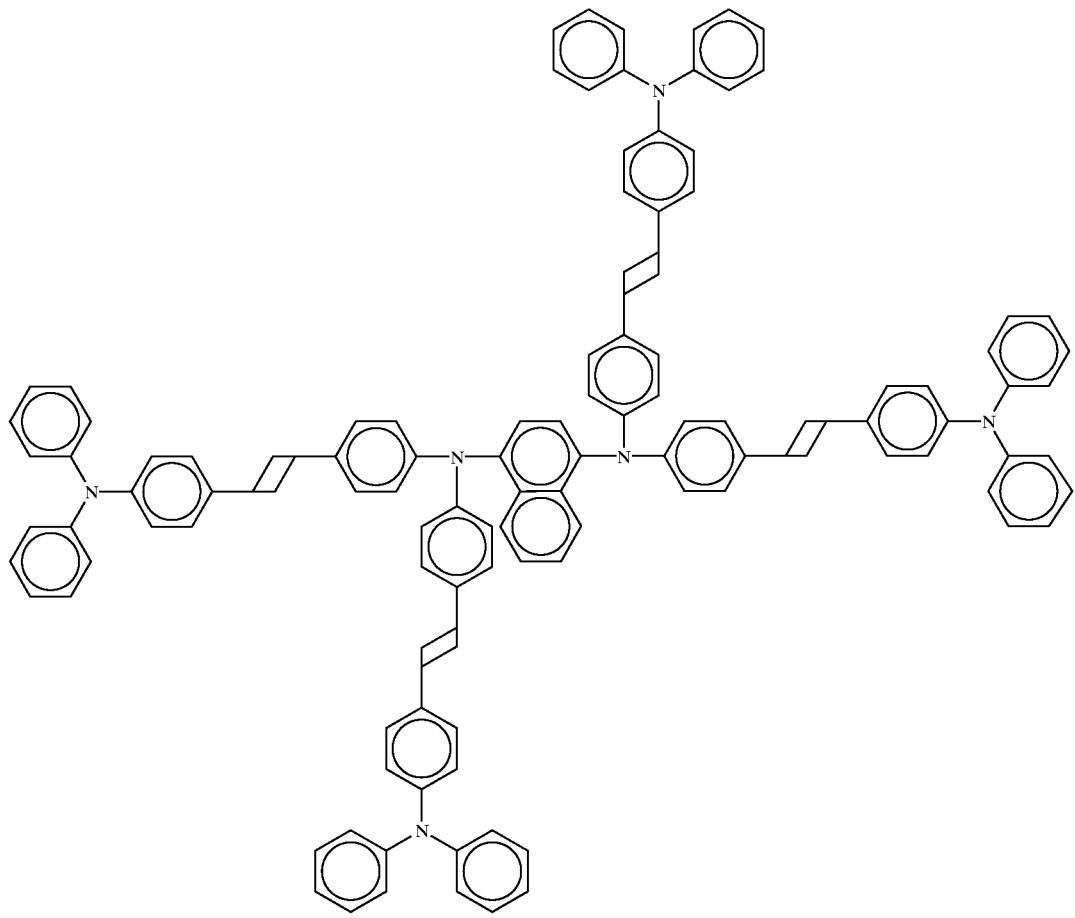
(22)

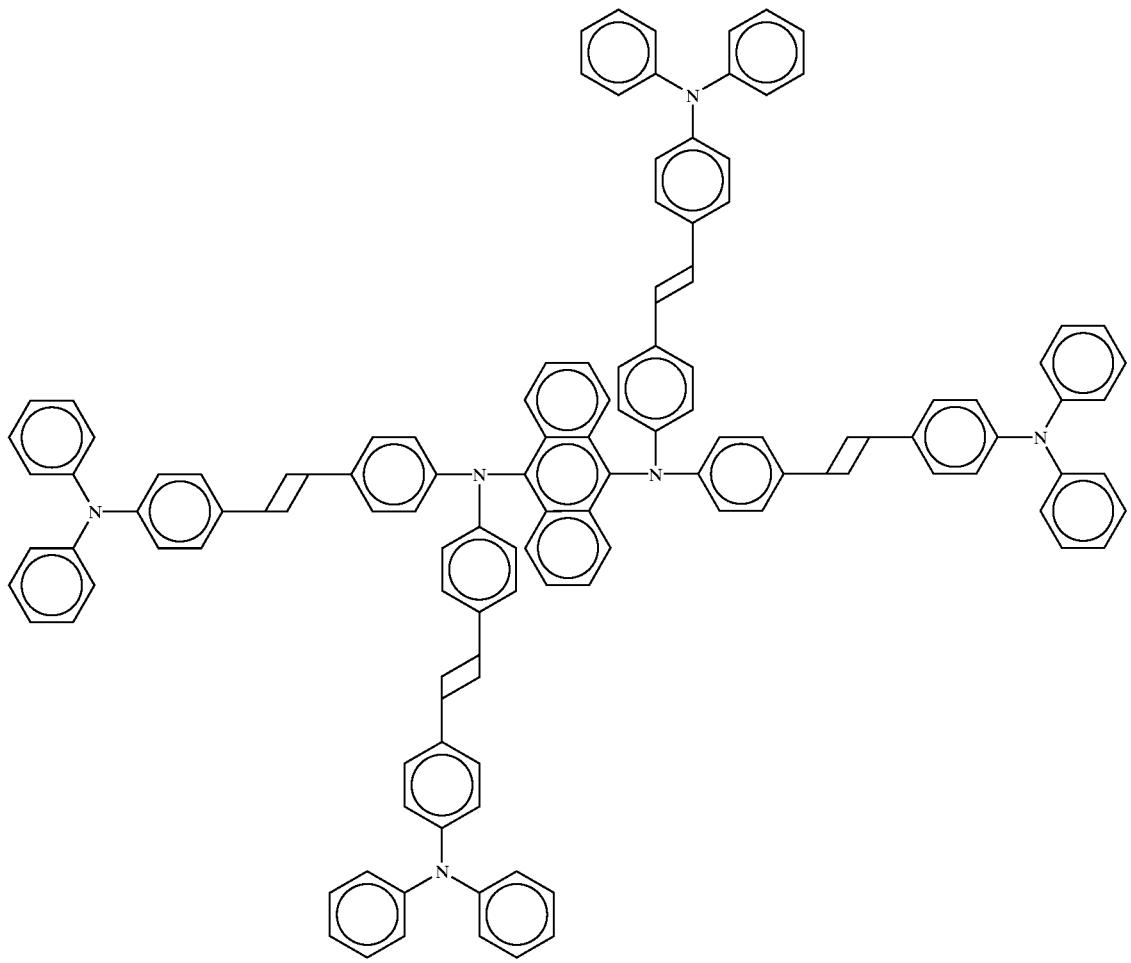

(23)

The compounds expressed in the general formula [1] can be synthesized by known processes. For example, Ullmann's reaction between diamino arylene and halogenated benzene or between dihalogenated arylene and aromatic amine provides a triphenylamine derivative. Styryl derivatives can be synthesized by synthesis of corresponding aldehyde and phosphonate, followed by Wittig-Hornor reaction therebetween.

The compounds used in the present invention include the compounds expressed in the general formula [3]. Each of $Ar_6$ to $Ar_8$ represents a substituted or non-substituted arylene group having 5–30 carbons, and each of $R_{14}$ to $R_{16}$ independently represents hydrogen atom, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group, examples of which include the substituent groups mentioned before.

Examples of the compounds expressed in the general formula [3] in the present invention include, but not limited thereto, the compounds shown below.

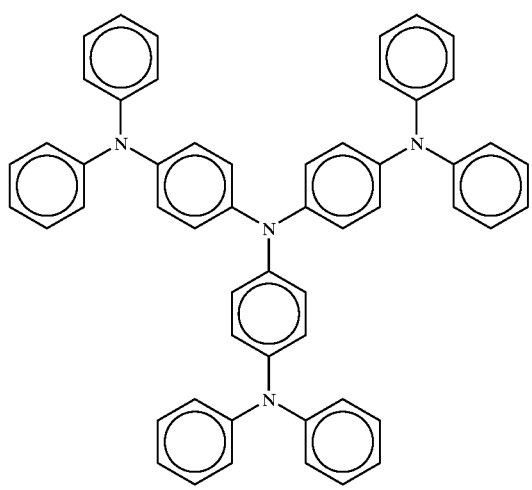 (HT-1)
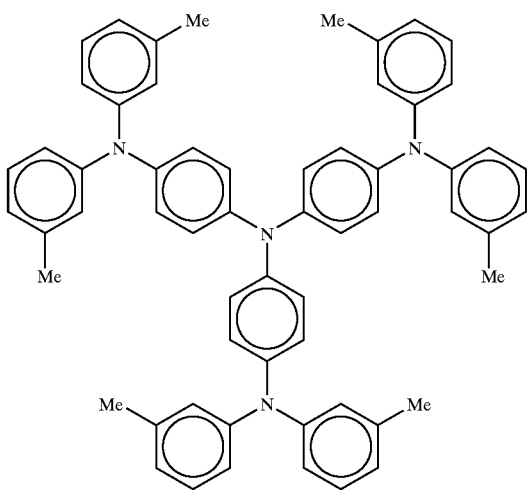 (HT-2)
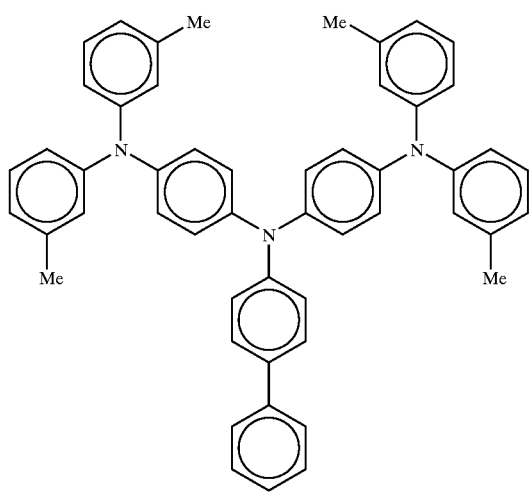 (HT-3)
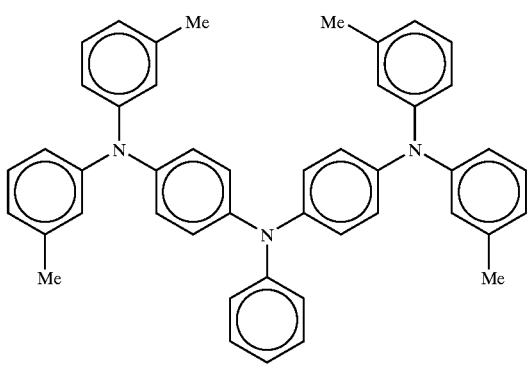 (HT-4)
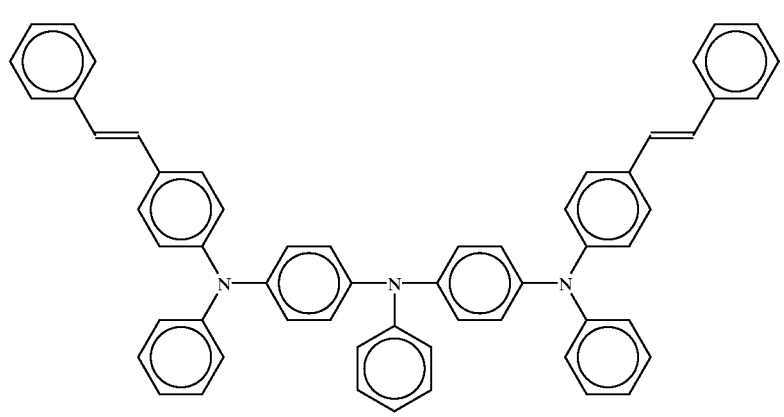 (HT-5)

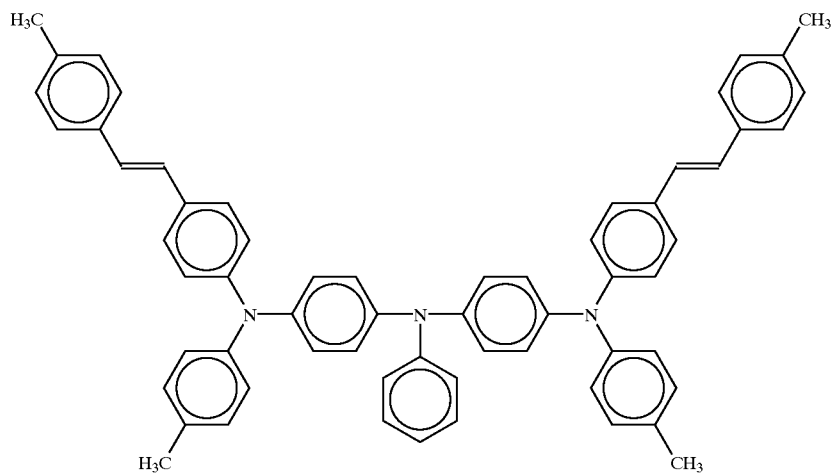
(HT-6)
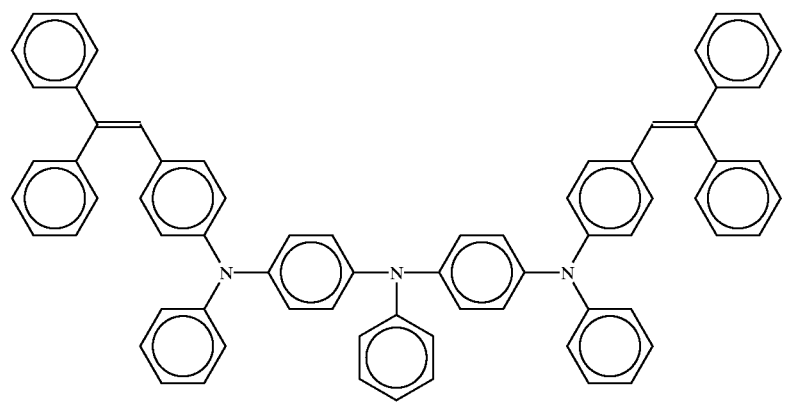
(HT-7)
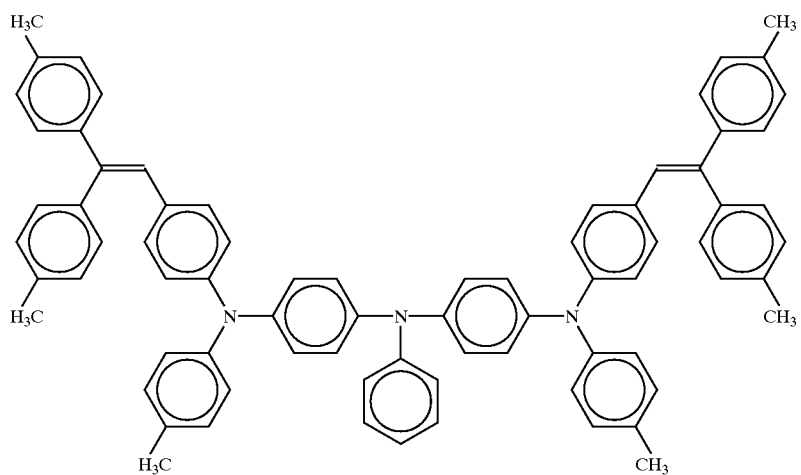
(HT-8)

(HT-9)
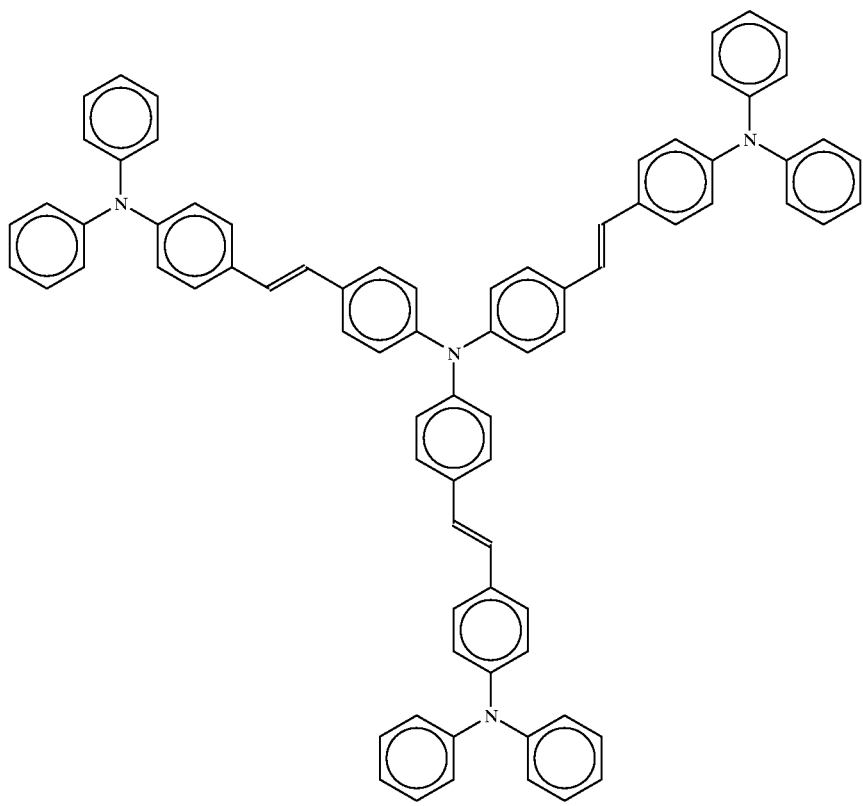
(HT-10)
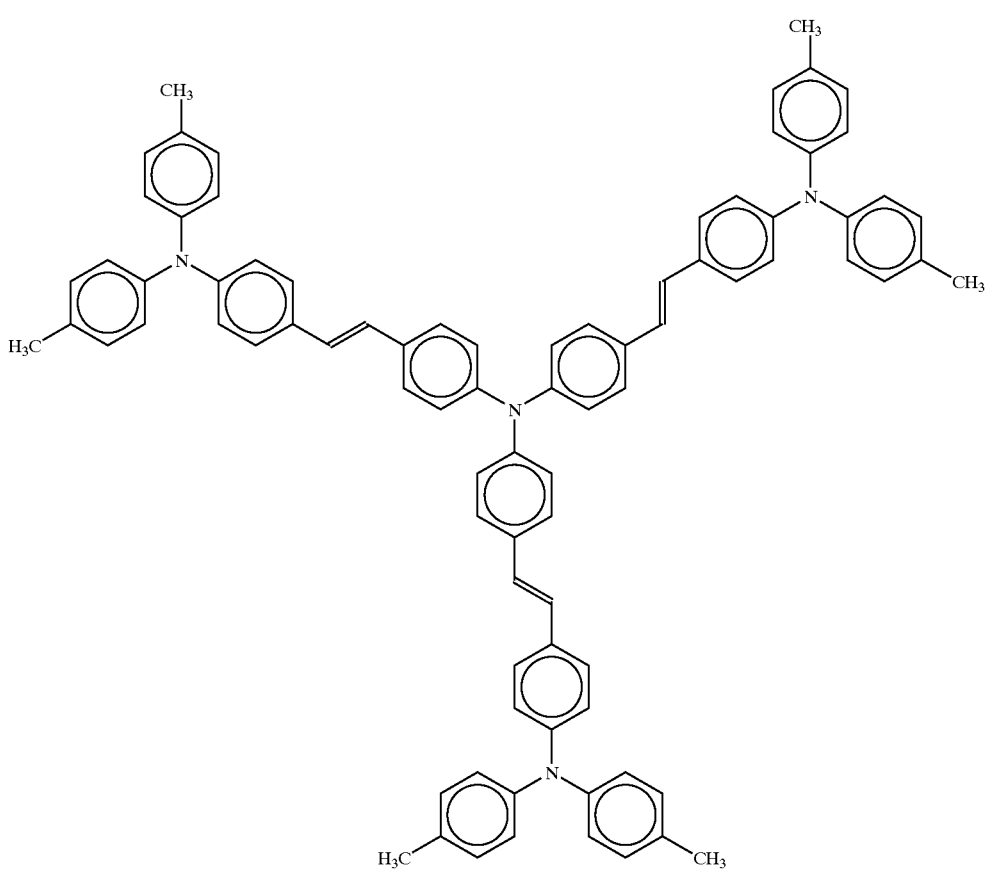

The compounds expressed in the general formula [3] can be synthesized by known Ullmann's reaction and Wittig-Hornor reaction.

Further, the compounds used in the present invention include compounds expressed in the general formula [4] to [7], wherein each of $Ar_9$ to $Ar_{20}$ independently represents aryl group having 6–20 carbons, and wherein $Ar_9$ and $Ar_{10}$, $Ar_{11}$ and $Ar_{12}$, $Ar_{13}$ and $Ar_{14}$, $Ar_{15}$ and $Ar_{16}$, $Ar_{17}$ and $Ar_{18}$, and/or $Ar_{19}$ and $Ar_{20}$ may form a ring therebetween.

The compounds used in the present invention include the compounds having structures expressed in the general formula [4] to [7], wherein at least one of $Ar_9$ to $Ar_{12}$, at least one of $Ar_{13}$ to $Ar_{16}$ and at least one of $Ar_{17}$ to $Ar_{20}$ represent the styryl groups expressed in the general formula [5]. Each of $Ar_9$ to $Ar_{20}$ independently represents aryl group having 6–20 carbons, wherein $Ar_9$ and $Ar_{10}$, $Ar_{11}$ and $Ar_{12}$, $Ar_{13}$ and $Ar_{14}$, $Ar_{15}$ and $Ar_{16}$, $Ar_{17}$ and $Ar_{18}$, and/or $Ar_{19}$ and $Ar_{20}$ may form a ring therebetween. Examples of the aryl group having 6–20 carbons include phenyl group, naphthyl group, anthryl group, phenanthryl group, naphthacenyl group, and pyrenyl group. Examples of the compounds forming a ring include carbazolyl group. Each of $R_{17}$ to $R_{45}$ independently represents hydrogen atom, halogen atom, hydroxyl group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group, examples of which include the substituent groups described before.

The compounds expressed in the general formula [4] to [7] include, but not limited thereto, the compounds shown below:

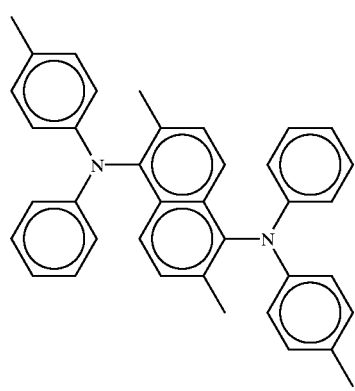

(24)

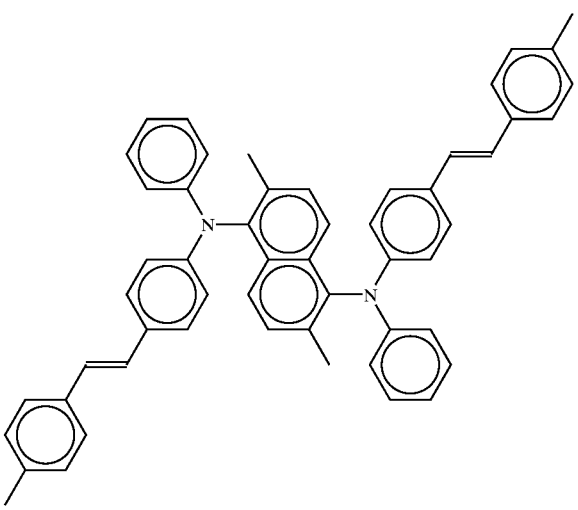

(25)

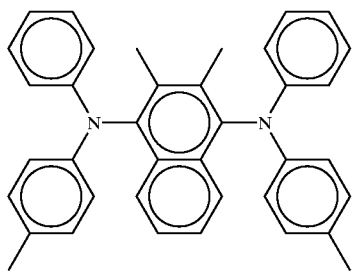

(26)

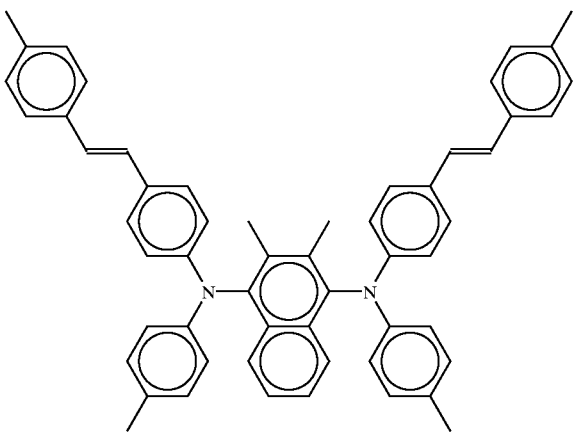

(27)

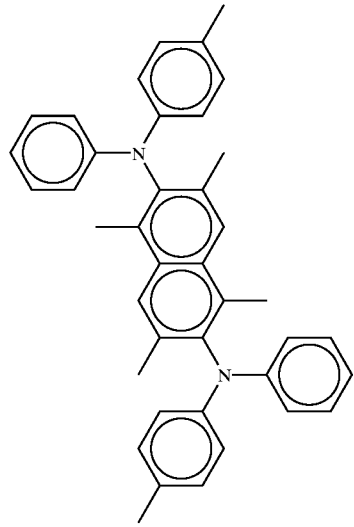

(28)

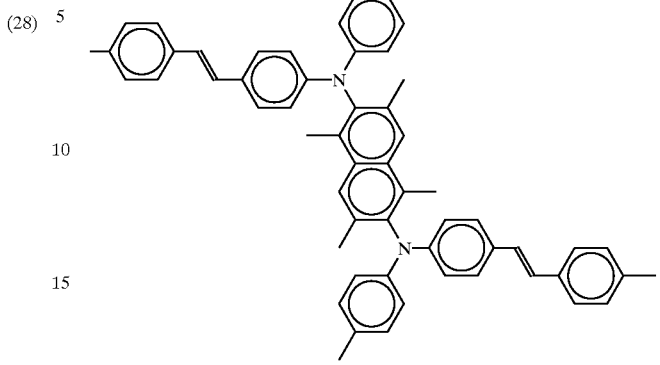

(29)

The compounds expressed in the general formula [4] to [7] can be synthesized by known processes. For example, Ullmann's reaction between diamino arylene and halogenated benzene or between dihalogenated arylene and aromatic amine provides a triphenylamine derivative. Styryl derivatives can be synthesized by synthesis of corresponding aldehyde and phosphonate, followed by Wittig-Hornor reaction therebetween.

Any material generally used as a conventional electron transport material can be used for the electron transport layer in the EL device of the present invention. Examples of such materials include, but are not limited to, oxadiazole derivatives, such as 2-(4-biphenyl)-5-(4-t-butylphneyl)-1,3,4-oxadiazole [01], bis{2-(4-t-butylphenyl)-1,3,4-oxadiazole}-m-phenylene[02], triazole derivatives such as compounds [03] and [04], and quinolinol based metallic complex such as compounds [05] to [08].

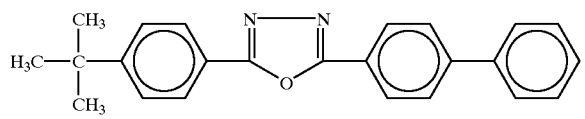

[01]

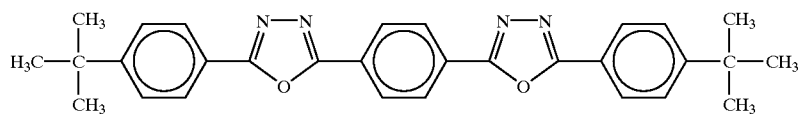

[02]

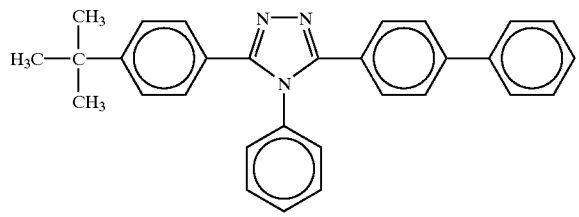

[03]

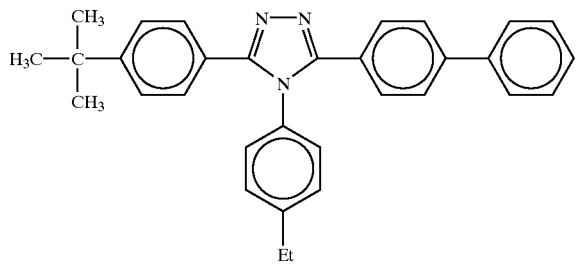

[04]

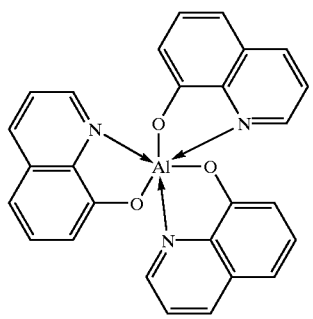
[05]

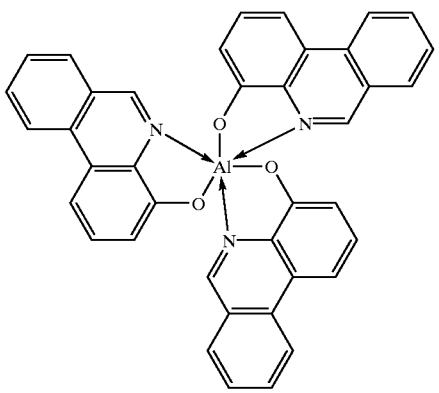
[06]

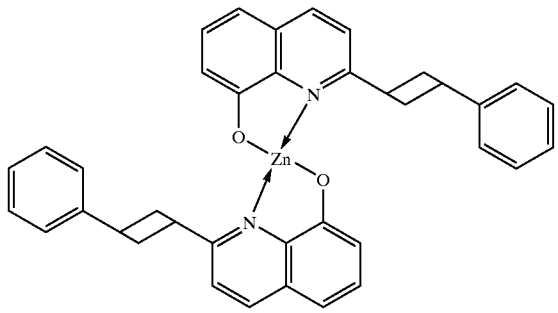
[07]

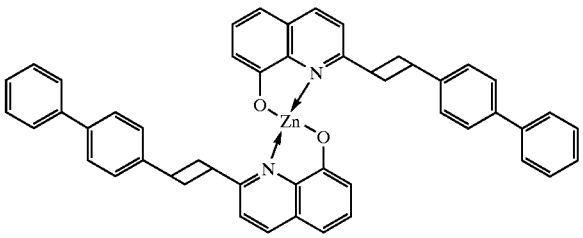
[08]

The anode of the organic thin-film EL device has a function for injecting positive holes into the hole transport layer and preferably has a work function equal to or above 4.5 eV. Examples of materials for the anode include indium tin oxide (ITO), tin oxide (NESA), gold, silver, platinum and copper. The cathode of the organic thin-film EL device has a function for injecting electrons into the electron transport zone or the luminescent layer and preferably has a smaller work function. Examples for the material for the cathode include indium, aluminum, magnesium, magnesium-indium alloy, magnesium-aluminum alloy, aluminum-lithium alloy, aluminum-scandium-lithium alloy, and magnesium-silver alloy.

Processes, such as vacuum evaporation or spin-coating, generally used for fabricating a conventional EL device can be used for the organic EL device of the present invention. Examples of such processes for forming the organic thin-film layer including the compounds expressed in the general formula [1] include, but not limited to, vacuum evaporation, molecular beam epitaxy (MBE), and dipping, spin-coating, casting, bar-coating or roll-coating of solutions wherein these materials are dissolved into solvents.

The organic layers in the organic EL device of the present invention may have any thickness. However, a preferable thickness generally resides between several nanometers and 1 micrometer. A smaller thickness tends to have a defect such as a pin-hole, whereas a larger thickness tends to require a high excitation voltage and may have a poor efficiency.

PREFERRED EMBODIMENTS OF THE INVENTION

Figure 1:
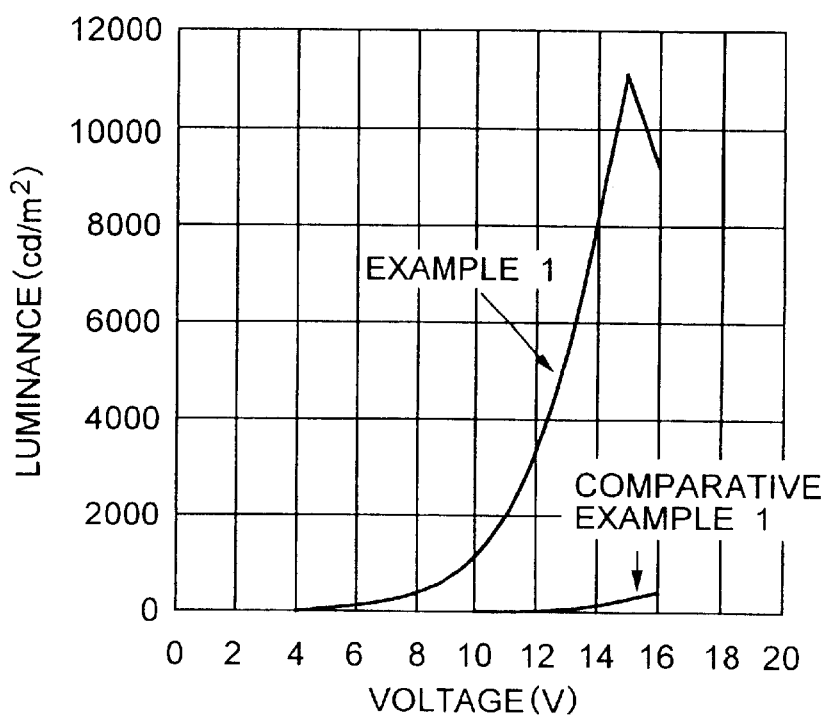
FIG. 1 is a graph for showing curves of applied voltage-current density.

Now, practical examples of the organic EL device, to which the present invention is not limited, will be described.

Synthesis of (1,5-bis(Phenyl-p-tolylamino) naphthalene 8 gram (0.05 mol) of 1,5-diamino naphthalene, 22 gram (0.11 mol) of iodobenzene, 17 gram (0.12 mol) of potassium carbonate, 0.4 gram of copper powder and 50 milliliter of nitrobenzene were introduced in a 100 milliliter three-necked flask for stirring at 200° C. for 30 hours. After the reaction, toluene was added, followed by filtration for removal of inorganic compounds. Toluene and nitrobenzene were removed by distillation in a reduced pressure ambient, and the remainder was subjected to separation refinement in a silica gel column using a 1:3 mixture solvent of toluene and ligroin, to prepare 10 gram of 1,5-bis(phenylamino) naphthalene. Thereafter, 6.2 gram (0.02 mol) of 1,5-bis (phenylamino)naphthalene, 11 gram (0.05 mol) of p-iodotoluene, 7 gram (0.05 mol) of potassium carbonate, 0.3 gram of copper powder and 50 milliliter of nitrobenzene were introduced in a 100 milliliter three-necked flask for stirring at 200° C. for 30 hours. After the reaction, toluene was added, followed by filtration for removal of inorganic compounds. Toluene and nitrobenzene were removed by distillation in a reduced pressure ambient, and the remainder was subjected to separation refinement in a silica gel column using a 1:3 mixture solvent of toluene and ligroin, to prepare 7 gram of 1,5-bis(phenyl-p-tolylamino)naphthalene.

Mono Formylation 4.9 gram (0.1 mol) of 1,5-di(phenyl-p-tolylamino) naphthalene was dissolved in 100 milliliter of toluene, followed by addition of 17.8 gram (0.1 mol) of phosphoryl trichloride and stirring at a room temperature. 13.5 gram (0.1 mol) of N-methyformanilide was dropped thereto, followed by stirring at 50° C. for five hours. After the reaction, the solution was slowly poured to 200 milliliter of cooled water, followed by transferring to a dividing funnel and washing the toluene layer with water several times until it was neutralized. After drying by using magnesium sulfate, the solvent was removed by distillation to prepare 5 gram of 1-(4-formylphenyl-p-tolylamino)-5-(phenyl-p-tolylamino) naphthalene.

Synthesis of Compound (1)

10 gram (0.04 mol) of diethyl benzylphosphonate, 0.2 gram (0.05 mol) of sodium hydride were added to 50 milliliter of dimethylsulfoxide, followed by stirring thereof at 50° C. for an hour. Thereafter, a solution of 21 gram (0.04 mol) of 1-(4-formylphenyl-p-tolyamino)-5-(phenyl-p-tolylamino)naphthalene dissolved in 50 milliliter of dimethylsulfoxide was dropped thereto, followed by stirring at 50° C. for three hours. After the reaction, the resultant product was poured into 50 milliliter of ice water, followed by addition of acid for neutralization and extraction using ethyl acetate. After the solvent was removed by reduced pressure, the resultant solution was separated by a silica gel column chromatography using 1:3 mixture solvent of toluene and ligroin as a developing solvent, and subjected to recrystallization from ethanol for refinement to prepare the compound (1).

Synthesis of HT-3

4-aminobiphenyl, 4-chloronitrobenzene, copper powder and potassium carbonate were reacted at 200° C. in an argon ambient for 30 hours. After the reaction, toluene was added thereto, followed by filtration for removal of inorganic compounds and removal of solvent by distillation to obtain a solid substance. The solid substance was recrystallized using a mixture solvent of toluene and methanol to prepare 4,4'-dinitro-4"-phenyl-triphenylamine, which was deoxidized using zinc to finally prepare 4,4'-diamino-4"-phenyl-triphenylamine.

Synthesis of 1,4-bis(4-Methyldiphenylamino)-2,3-dimethylnaphthalene 9 gram (29 mmol) of 1,4-dibromo-2,3-dimethylnaphthalene, 12.6 gram (69 mmol) of 4-methyldiphenylamine, 2.8 gram (21 mmol) of potassium carbonate and 0.3 gram (5 mmol) of copper powder were introduced in a 100 milliliter three-necked flask for stirring at 200° C. for 30 hours. Toluene was added thereto after the reaction, followed by filtration for removal of inorganic compounds. Toluene was removed by distillation in a reduced pressure ambient, and the remainder was subjected to separation refinement in a silica gel column using a 1:3 mixture solvent of toluene and ligroin to prepare 8 gram of 1,4-bis(4-methyldiphenylamino)-2,3-dimethylnaphthalene.

Diformylation 5.2 gram (0.01 mol) of 1,4-bis(4-methyldiphenylamino)-2,3-dimethylnaphthalene was dissolved in 100 milliliter of toluene, followed by consecutive addition of 3.6 (0.02 mol) gram of phosphoryl trichloride, stirring at a room temperature, dropping 2.7 gram (0.02 mol) of N-methylformanilide, and stirring 50° C. for five hours. After the reaction, the resultant product was poured slowly into 200 milliliter of cooled water, followed by transferring to a dividing funnel and washing of toluene layer with water for several times until it was neutralized. After drying using magnesium sulfate, the solvent was removed by distillation to synthesize 4 gram of 1,4-bis(4-methyl-4'-formyldiphenylamino)-2,3-dimethylnaphthalene.

Synthesis of Compound (27)

2.3 gram (10 mmol) of diethyl benzylphosphonate and 0.24 gram (10 mmol) of sodium hydride were added to 50 milliliter of dimethylsulfoxide and stirred at 50° C. for an hour. A solution of 2.3 gram (0.5 mmol) of 1,4-bis(4-methyl-4'-formyldiphenylamino)-2,3-dimethylnaphthalene dissolved in 50 milliliter of dimethylsulfoxide was dropped thereto, followed by stirring at 50° C. for three hours. After the reaction, the resultant solution was poured in 50 milliliter of cooled water, added by acid for neutralization, and extracted by ethyl acetate. After drying using magnesium sulfate, the solvent was removed by distillation, followed by separation refinement in a silica gel column using a 1:3 mixture solvent of toluene and ligroin to 5 synthesize the compound (27).

EXAMPLE 1

Figure 3:
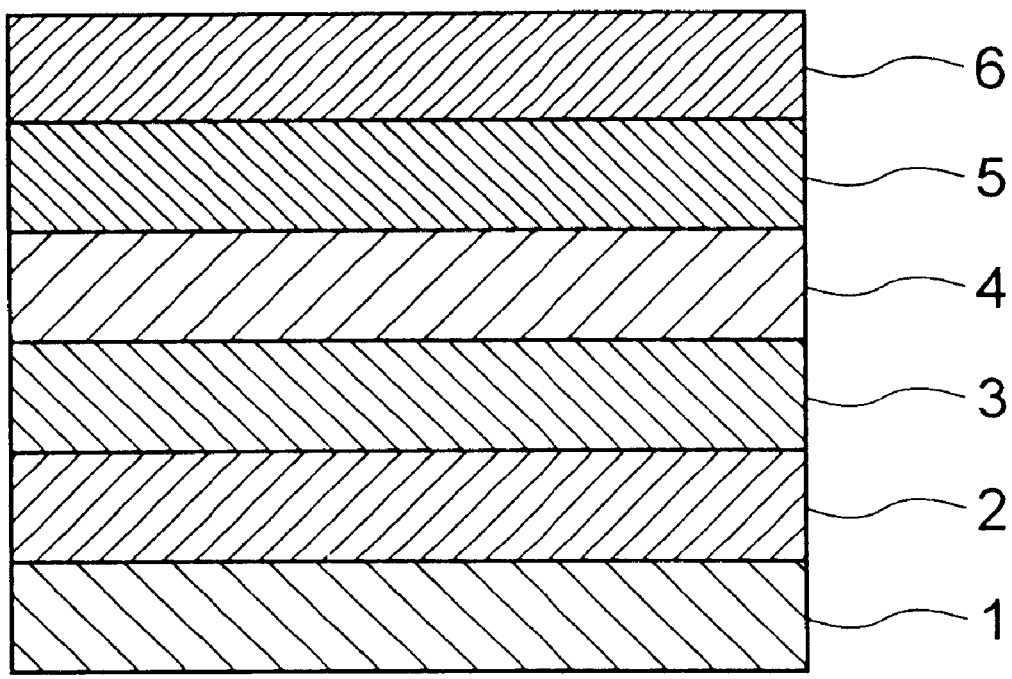
FIG. 3 is a sectional view of an organic EL device according to an embodiment of the present invention.

Example 1 of the present invention had a structure shown in FIG. 3. The EL device had a structure of anode/hole transport layer/luminescent layer/electron transport layer/cathode. An ITO film was sputtered onto a glass substrate 1 to form an anode 2 having a sheet resistance of 20 Ω/□. Thereafter, [HT-3] was formed thereon as a hole transport layer 3 to a thickness of 50 nm (nanometers) by using a vacuum evaporation technique. Further, a luminescent layer 4 having the compound (1) was formed by vacuum evaporation to a thickness of 40 nm. Thereafter, an electron transport layer 5 made of compound [01] was formed by a vacuum evaporation technique to a thickness of 20 nm. A cathode 6 having a magnesium-silver alloy was formed thereon by vacuum evaporation to a thickness of 200 nm, thereby achieving an organic EL device of FIG. 3. The EL device thus fabricated exhibited a luminescence of 8000 $cd/m^2$ in blue light at an applied DC voltage of 14 volts, with a maximum luminescent efficiency of 2.5 lm/W.

EXAMPLES 2–34

Examples 2–34 of the present invention were fabricated similarly to Example 1 except for the hole transport material, luminescent material and electron transport material used in these examples, which are tabulated in Table 1 shown below. Table 1 also shows the corresponding luminance and maximum luminescent efficiencies at an applied DC voltage of 14 volts.

| EXAMPLE | H, T, M | L, M | E, T, M | LUMINANCE (cd/m²) | M, L, E (lm/W) |
|---|---|---|---|---|---|
| 2 | HT-10 | (1) | [02] | 8000 | 2.6 |
| 3 | HT-3 | (2) | [02] | 7000 | 2.6 |
| 4 | HT-10 | (2) | [01] | 7500 | 2.7 |
| 5 | HT-3 | (3) | [01] | 6000 | 2.5 |
| 6 | HT-10 | (3) | [02] | 6500 | 2.5 |
| 7 | HT-3 | (5) | [02] | 7000 | 2.6 |
| 8 | HT-10 | (5) | [01] | 7300 | 2.7 |
| 9 | HT-1 | (6) | [04] | 6000 | 2.4 |
| 10 | HT-2 | (6) | [04] | 6200 | 2.5 |
| 11 | HT-4 | (7) | [06] | 8000 | 2.6 |
| 12 | HT-5 | (7) | [06] | 8500 | 2.6 |
| 13 | HT-3 | (8) | [01] | 5000 | 2.7 |
| 14 | HT-10 | (8) | [02] | 5500 | 2.7 |
| 15 | HT-3 | (9) | [02] | 6200 | 2.6 |
| 16 | HT-10 | (9) | [01] | 6500 | 2.7 |
| 17 | HT-3 | (10) | [01] | 7000 | 2.6 |
| 18 | HT-10 | (10) | [02] | 6500 | 2.5 |
| 19 | HT-3 | (11) | [02] | 7000 | 2.6 |
| 20 | HT-10 | (11) | [01] | 7300 | 2.7 |
| 21 | HT-3 | (12) | [04] | 6000 | 2.4 |
| 22 | HT-10 | (12) | [04] | 6200 | 2.5 |
| 23 | HT-3 | (13) | [06] | 8000 | 2.6 |
| 24 | HT-10 | (13) | [06] | 8500 | 2.6 |
| 25 | HT-6 | (14) | [01] | 5000 | 2.7 |
| 26 | HT-7 | (15) | [02] | 5500 | 2.7 |
| 27 | HT-8 | (16) | [01] | 6200 | 2.6 |
| 28 | HT-9 | (17) | [02] | 6500 | 2.7 |
| 29 | HT-10 | (18) | [02] | 7000 | 2.6 |
| 30 | HT-1 | (19) | [01] | 7400 | 2.5 |
| 31 | HT-2 | (20) | [07] | 7000 | 2.6 |
| 32 | HT-3 | (21) | [07] | 7600 | 2.7 |
| 33 | HT-4 | (22) | [08] | 6500 | 2.5 |
| 34 | HT-5 | (23) | [08] | 7000 | 2.6 |

H, T, M: HOLE TRANSPORT MATERIAL
L, M: LUMINESCENT MATERIAL
E, T, M: ELECTRON TRANSPORT MATERIAL
M, L, E: MAXIMUM LUMINESCENT EFFICIENCY

These examples exhibited half-luminance lifetimes above 5000 hours after continuous excitation thereof with an initial luminance at 100 cd/m².

EXAMPLE 35

Example 35 of the present invention had a structure shown in FIG. 3. The EL device included anode/hole transport layer/luminescent layer/electron transport layer/cathode. An ITO film was sputtered onto a glass substrate 1 to form an anode 2 having a sheet resistance of 20 Ω/□. Thereafter, [HT-3] was formed thereon as a hole transport layer 3 to a thickness of 50 nm by using a vacuum evaporation technique. Further, a luminescent layer 4 having the compound (24) was formed by vacuum evaporation to a thickness of 40 nm. Thereafter, an electron transport layer 5 made of the compound [01] was formed by a vacuum evaporation technique to a thickness of 20 nm. A cathode 6 having a magnesium-silver alloy was formed thereon to a thickness of 200 nm, thereby achieving an organic EL device of FIG. 3. The EL device thus fabricated exhibited a luminance of 5000 cd/m² in blue light at an applied DC voltage of 14 volts, with the maximum luminescent efficiency of 2.2 lm/W.

EXAMPLES 36–46

Examples 36–46 of the present invention were fabricated similarly to Example 35 except for the hole transport material and luminescent material used in these examples, which are tabulated in Table 2 shown below. Table 2 also shows the corresponding luminance and maximum luminescent efficiencies at an applied DC voltage of 14 volts. All the EL devices thus fabricated exhibited blue luminescent light having an excellent color purity.

| EXAMPLE | H, T, M | L, M | E, T, M | LUMINANCE (cd/m²) | M, L, E (lm/W) |
|---|---|---|---|---|---|
| 36 | HT-10 | (24) | [02] | 5100 | 2.3 |
| 37 | HT-3 | (25) | [07] | 6200 | 2.5 |
| 38 | HT-10 | (25) | [08] | 8000 | 2.6 |
| 39 | HT-3 | (26) | [08] | 5000 | 2.1 |
| 40 | HT-10 | (26) | [07] | 5000 | 2.2 |
| 41 | HT-3 | (27) | [01] | 5500 | 2.7 |
| 42 | HT-10 | (27) | [01] | 6200 | 2.6 |
| 43 | HT-6 | (28) | [02] | 5000 | 2.1 |
| 44 | HT-7 | (28) | [07] | 5000 | 2.1 |
| 45 | HT-3 | (29) | [08] | 8000 | 2.6 |
| 46 | HT-10 | (29) | [08] | 8500 | 2.6 |

These examples exhibited half-luminance lifetimes above 5000 hours after continuous excitation thereof with an initial luminance at 100 cd/m².

COMPARATIVE EXAMPLE 1

Comparative Example 1 was fabricated similarly to Example 1 except for N,N'-diphenyl-N-N'-bis(1-naphthyl)-1,1'-biphenyl)-4,4'-diamine [HT-A, shown below] used as the hole transport layer. This example exhibited a luminance of 200 cd/m² in blue light and a maximum luminescence efficiency of 0.25 lm/W at an applied DC voltage of 14 volts.

COMPARATIVE EXAMPLE 2

Example 2 was fabricated similarly to Example 1 except for N,N'-diphenyl-N-N'-bis(3-methylphenyl)-1,1'-biphenyl-4–4'-diamine [HT-B, shown below] used for the hole transport layer. This example exhibited a luminance of 300 cd/m² in blue light and a maximum luminescence efficiency of 0.3 lm/W at an applied DC voltage of 14 volts.

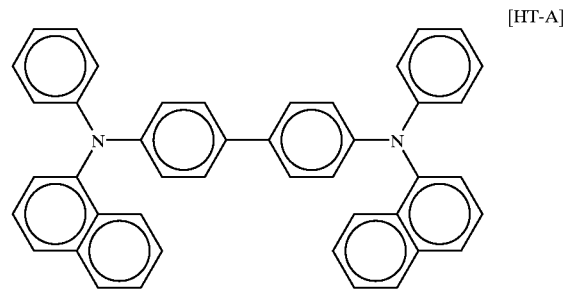

[HT-A]

-continued

[HT-B]

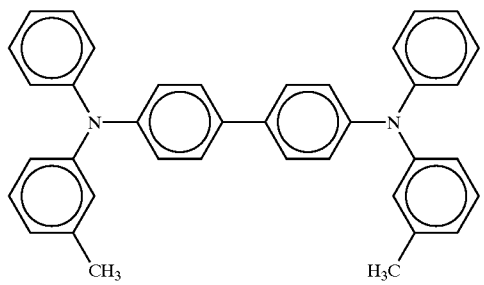

Figure 2:
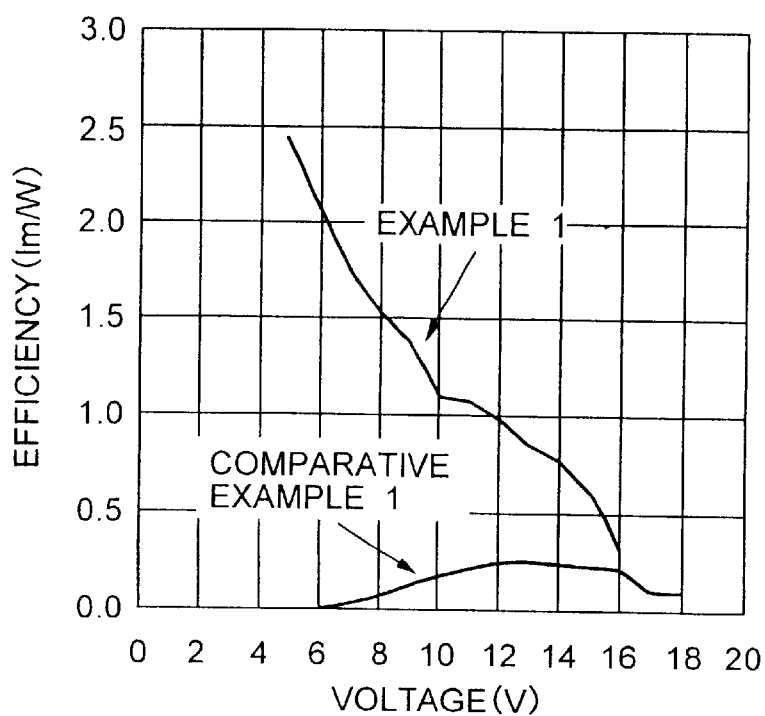
FIG. 2 is a graph for showing curves of applied voltage-luminance.

FIGS. 1 and 2 show characteristic curves of applied voltage-current density and applied voltage-luminance, respectively, for the EL devices fabricated as Example 1 and Comparative Example 1. As understood from these figures, Example 1 exhibited an excellent luminance 40 times higher and an excellent luminescence efficiency 10 times higher compared to Comparative Example 1, at an applied voltage of 14 volts. The EL devices fabricated according to the present invention and not shown in the figure also exhibited excellent luminance and luminescent efficiency compared to Comparative Examples.

COMPARATIVE EXAMPLE 3

Comparative Example 3 was fabricated similarly to Example 41 except for 1,4-bis(2,2-diphenylvinyl) (EM-1, shown below) used as the luminescent material. This comparative example exhibited a luminance of 5000 cd/m2 in light blue at an applied voltage of 14 volts, whereas Examples 35 to 46 according to the present invention exhibited blue light having color purity higher than that of Comparative Example 3.

(EM-1)

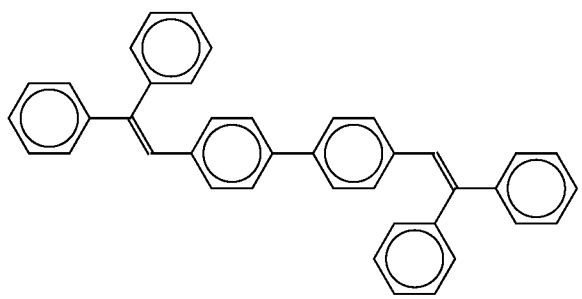

Since the above embodiments are described only for examples, the present invention is not limited to the above embodiments and various modifications or alterations can be easily made therefrom by those skilled in the art without departing from the scope of the present invention.

What is claimed is:

1. An organic electroluminescent (EL) device comprising an anode, a cathode, and a luminescent layer and a hole transport layer both disposed between said anode and said cathode, said luminescent layer including, in a form of a mixture or a single substance, a compound expressed in a general formula (1) as follows:

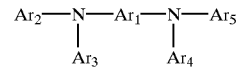

[1]

wherein $Ar_1$ represents a substituted or non-substituted arylene group having 5–30 carbons, each of $Ar_2$ to $Ar_5$ independently represents a substituted or non-substituted aryl group having 6–20 carbons, $Ar_2$ and $Ar_3$ and/or $Ar_4$ and $Ar_5$ may form a ring therebetween, at least one of $Ar_2$ to $Ar_5$ having a styryl group expressed in a general formula (2) as follows:

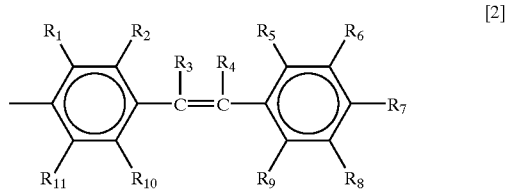

[2]

wherein each of $R_1$ to $R_{11}$ independently represents hydrogen atom, halogen atom, hydroxy group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group, said hole transport layer including, in a form of a mixture or a single substance, a compound expressed in a general formula (3) as follows:

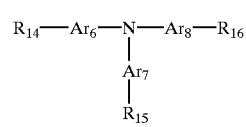

[3]

wherein each of $Ar_6$ to $Ar_8$ represents a substituted or non-substituted arylene group having 5–30 carbons, each of $R_{14}$ to $R_{16}$ independently represents hydrogen atom, halogen atom, hydroxy group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group, and wherein each of at least two of $R_{14}$ to $R_{16}$ in the general formula (3) represents a diarylamino group expressed by —$NAr_9Ar_{10}$, each of given $Ar_9$ to $Ar_{10}$ independently representing a substituted or non-substituted aryl group.

2. The organic EL device as defined in claim 1, wherein $Ar_1$ in the general formula [1] represents a naphthylene group or anthrylene group.

3. An organic electroluminescent (EL) device comprising an anode, a cathode, and a luminescent layer and a hole transport layer both disposed between said anode and said cathode, said luminescent layer including, in a form of a mixture or a single substance, a compound expressed in a general formula (1) as follows:

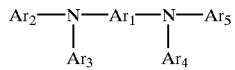
[1]

wherein $Ar_1$ represents a substituted or non-substituted arylene group having 5–30 carbons, each of $Ar_2$ to $Ar_5$ independently represents a substituted or non-substituted aryl group having 6–20 carbons, $Ar_2$ and $Ar_3$ and/or $Ar_4$ and $Ar_5$ may form a ring therebetween, at least one of $Ar_2$ to $Ar_5$ having a styryl group expressed in a general formula (2) as follows:

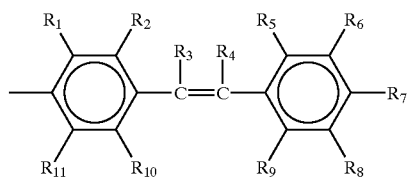
[2]

wherein each of $R_1$ to $R_{11}$ independently represents hydrogen atom, halogen atom, hydroxy group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group, said hole transport layer including, in a form of a mixture or a single substance, a compound expressed in a general formula (3) as follows:

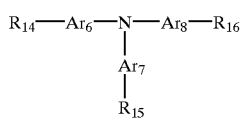
[3]

wherein each of $Ar_6$ to $Ar_9$ represents a substituted or non-substituted arylene group having 5–30 carbons, and wherein each of $R_{14}$ to $R_{16}$ represents a substituted or non-substituted 4-(diphenylamino)styryl group.

4. An organic electroluminescent (EL) device comprising an anode, a cathode, and a luminescent layer disposed therebetween, said luminescent layer including, in a form of a mixture or a single substance, a compound expressed in a general formula (4) as follows:

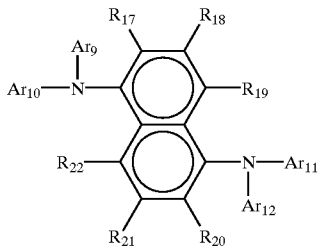
[4]

wherein each of $Ar_9$ to $Ar_{12}$ represents a substituted or non-substituted aryl group having 6–20 carbons, $Ar_9$ and $Ar_{10}$ and/or $Ar_{11}$ and $Ar_{12}$ may form a ring therebetween, each of $R_{17}$ to $R_{22}$ independently represents hydrogen atom, halogen atom, hydroxy group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or sub-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group, and $R_{17}$ and $R_{20}$ are not hydrogen atoms.

5. The organic EL device as defined in claim 4, wherein at least one of $Ar_9$ to $Ar12$ in the general formula (4) represents a compound expressed in a general formula (5) as follows:

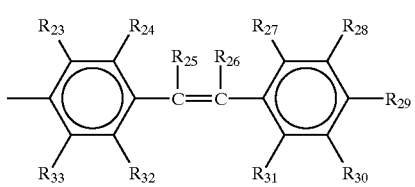
[5]

wherein each of $R_{23}$ to $R_{33}$ independently represents hydrogen atom, halogen atom, hydroxy group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group.

6. An organic electroluminescent (EL) device comprising an anode, a cathode, and a luminescent layer disposed therebetween, said luminescent layer including, in a form of a mixture or a single substance, a compound expressed in a general formula (6) as follows;

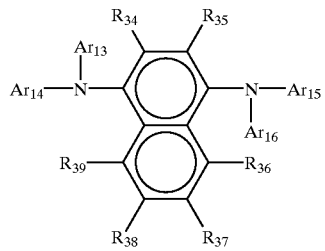

[6]

wherein each of $Ar_{13}$ to $Ar_6$ represents a substituted or non-substituted aryl group having 6–20 carbons, $Ar_{13}$ and $Ar_{14}$ and/or $Ar_{15}$ and $Ar_{16}$ may form a ring therebetween, each of $R_{34}$ to $R_{39}$ independently represents hydrogen atom, halogen atom, hydroxy group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group or a carboxyl group, and $R_{34}$ and $R_{35}$ are not hydrogen atoms.

7. The organic EL device as defined in claim 6, wherein at least one of $Ar_{13}$ to $Ar_{16}$ in the general formula (6) represents a compound expressed in a general formula (5) as follows:

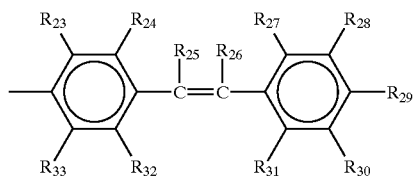

[5]

wherein each of $R_{23}$ to $R_{33}$ independently represents hydrogen atom, halogen atom, hydroxy group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group.

8. An organic electroluminescent (EL) device comprising an anode, a cathode, and a luminescent layer disposed therebetween, said luminescent layer including, in a form of a mixture or a single substance, a compound expressed in a general formula (7) as follows:

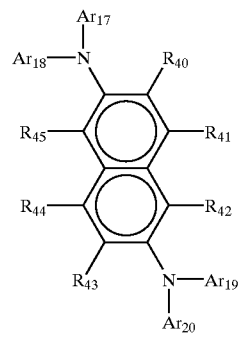

[7]

wherein each of $Ar_{17}$ to $Ar_{20}$ represents a substituted or non-substituted aryl group having 6–20 carbons, $Ar_{17}$ and $Ar_{18}$ and/or $Ar_{19}$ and $Ar_{20}$ may form a ring therebetween, each of $R_{40}$ to $R_{45}$ independently represents hydrogen atom, halogen atom, hydroxy group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group, and $R_{40}$, $R_{42}$, $R_{43}$ and $R_{45}$ are not hydrogen atoms.

9. The organic EL device as defined in claim 8, wherein at least one of $Ar_{17}$ to $Ar_{20}$ in the general formula (7) represents a compound expressed in a general formula (5) as follows:

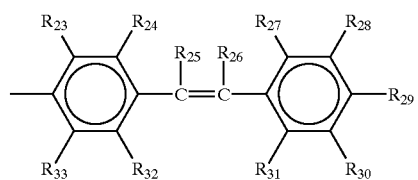

[5]

wherein each of $R_{23}$ to $R_{33}$ independently represents hydrogen atom, halogen atom, hydroxy group, substituted or non-substituted amino group, cyano group, nitro group, substituted or non-substituted alkyl group, substituted or non-substituted alkenyl group, substituted or non-substituted cycloalkyl group, substituted or non-substituted alkoxy group, substituted or non-substituted aromatic hydrocarbon group, substituted or non-substituted aromatic heterocyclic group, substituted or non-substituted aralkyl group, substituted or non-substituted aryloxy group, substituted or non-substituted alkoxycarbonyl group, or a carboxyl group.

* * * * *